United States Patent
Saenz et al.

(10) Patent No.: US 10,319,437 B2
(45) Date of Patent: Jun. 11, 2019

(54) APPARATUS AND METHOD FOR IDENTIFYING MEMORY CELLS FOR DATA REFRESH BASED ON MONITOR CELL IN A RESISTIVE MEMORY DEVICE

(71) Applicant: SanDisk Technologies LLC, Plano, TX (US)

(72) Inventors: Juan Saenz, Menlo Park, CA (US); Christopher J Petti, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/710,247

(22) Filed: Sep. 20, 2017

(65) Prior Publication Data

US 2019/0088315 A1 Mar. 21, 2019

(51) Int. Cl.
*G11C 13/00* (2006.01)

(52) U.S. Cl.
CPC ...... *G11C 13/0002* (2013.01); *G11C 13/0033* (2013.01); *G11C 2213/71* (2013.01); *G11C 2213/75* (2013.01)

(58) Field of Classification Search
CPC ............ G11C 13/0033; G11C 13/0002; G11C 2213/71; G11C 2213/75
See application file for complete search history.

(56) References Cited

U.S. PATENT DOCUMENTS

| 5,999,448 | A | 12/1999 | Kurihara et al. |
| 2004/0022085 | A1* | 2/2004 | Parkinson ........... G11C 11/5678 365/113 |
| 2004/0114427 | A1 | 6/2004 | Hamaguchi |
| 2008/0151669 | A1* | 6/2008 | Bill ..................... G11C 11/406 365/222 |

(Continued)

FOREIGN PATENT DOCUMENTS

| EP | 1426971 A2 | 6/2004 |
| EP | 1717817 A1 | 11/2006 |

OTHER PUBLICATIONS

International Search Report & The Written Opinion of the International Searching Authority dated Sep. 10, 2018, International Application No. PCT/US2018/033698 filed May 21, 2018.

*Primary Examiner* — Mushfique Siddique
(74) *Attorney, Agent, or Firm* — Vierra Magen Marcus LLP

(57) ABSTRACT

Technology is described for identifying non-volatile memory cells having data that should be refreshed. The technology could be used to identify which groups of memory cells that store cold data should have a data refresh. In one aspect, a non-volatile storage device has at least one monitor memory cell associated with a group of data memory cells. The non-volatile storage device may use different programming techniques to program the data and monitor memory cells. In one aspect, the programming technique used for the monitor memory cell is less stable with respect to state than the technique used to program the (Continued)

associated data memory cells. The state of the monitor memory cell may change in a predictable manner, such that the state of the monitor cell may be sensed periodically to determine whether the associated data memory cells should be refreshed.

20 Claims, 16 Drawing Sheets

(56) References Cited

U.S. PATENT DOCUMENTS

| | | | |
|---|---|---|---|
| 2009/0010048 A1* | 1/2009 | Fuji | G11C 11/406 365/163 |
| 2009/0034343 A1* | 2/2009 | Nirschl | G11C 13/0004 365/189.07 |
| 2009/0147581 A1 | 6/2009 | Isobe | |
| 2010/0046270 A1* | 2/2010 | Katoh | G11C 11/5685 365/100 |
| 2010/0321987 A1* | 12/2010 | Lung | G11C 13/0004 365/163 |
| 2011/0013446 A1* | 1/2011 | Lung | G11C 11/5678 365/163 |
| 2012/0063196 A1* | 3/2012 | Kim | G11C 13/0004 365/148 |
| 2012/0257437 A1* | 10/2012 | Seko | G11C 11/5678 365/148 |
| 2015/0134897 A1* | 5/2015 | Sriramagiri | G11C 11/406 711/106 |
| 2016/0170682 A1 | 6/2016 | Bakshi et al. | |
| 2016/0180959 A1 | 6/2016 | Darragh et al. | |
| 2016/0189774 A1* | 6/2016 | Xie | G11C 13/0004 365/163 |
| 2016/0284399 A1* | 9/2016 | Mantegazza | G11C 13/004 |

* cited by examiner

APPARATUS AND METHOD FOR IDENTIFYING MEMORY CELLS FOR DATA REFRESH BASED ON MONITOR CELL IN A RESISTIVE MEMORY DEVICE

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a power source.

One example of non-volatile memory uses memory cells that include reversible resistance-switching memory elements that may be set to two or more different resistance states, such as a low resistance state and a high resistance state. The memory cells may be individually connected between first and second conductors (e.g., a bit line electrode and a word line electrode). The state of such a memory cell is typically changed by proper voltages being placed on the first and second conductors. Such memory cells may be referred to herein as "resistive random access memory" (ReRAM). Since the resistivity of the memory element may be repeatedly switched between high a low resistance states, such memory cells may also be referred to as reversible resistivity memory cells.

Other non-volatile memory cells store data based on some other physical parameter. For example, some memory cells are programmed by storing charge in a charge storage region to impact a threshold voltage of the non-volatile memory cell. Such memory cells may be programmed to different threshold voltage states.

Some data stored in a storage system may be static over a long period of time. For example, a solid state drive might store data for archival purposes. Other data could be intentionally changed quite frequently. Herein, the frequency with which data is programmed is referred to as the "temperature" of the data. The more frequently the data is programmed, the hotter the data is, as defined herein.

For a variety of reasons, the state of a non-volatile memory cell is typically not permanent. For example, the resistance of a ReRAM cell may change over time. If the data stored in a group of memory cells is relatively hot, there might not be a need to refresh the data. However, for cold data, there could be a need to refresh the data at some point in time.

BRIEF SUMMARY

One embodiment includes an apparatus, comprising a plurality of non-volatile memory cells comprising a group of data memory cells and a monitor memory cell. The plurality of non-volatile memory cells are resistance random access memory (ReRAM) cells. The apparatus further includes a control circuit in communication with the plurality of non-volatile memory cells. The control circuit is configured to program the group of data memory cells with a first programming technique, including program the group of data memory cells to their program resistance from a first resistance direction. The control circuit is configured to program the monitor memory cell with a second programming technique for which state retention is less stable than the first programming technique, including program the monitor memory cell to its monitor resistance from a second resistance direction opposite the first resistance direction, the monitor memory cell programmed contemporaneously with the group of data memory cells. The control circuit is configured to identify the group of data memory cells for data refresh responsive to a determination that the monitor memory cell has incurred a state shift of more than a threshold.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

Figure 1A:
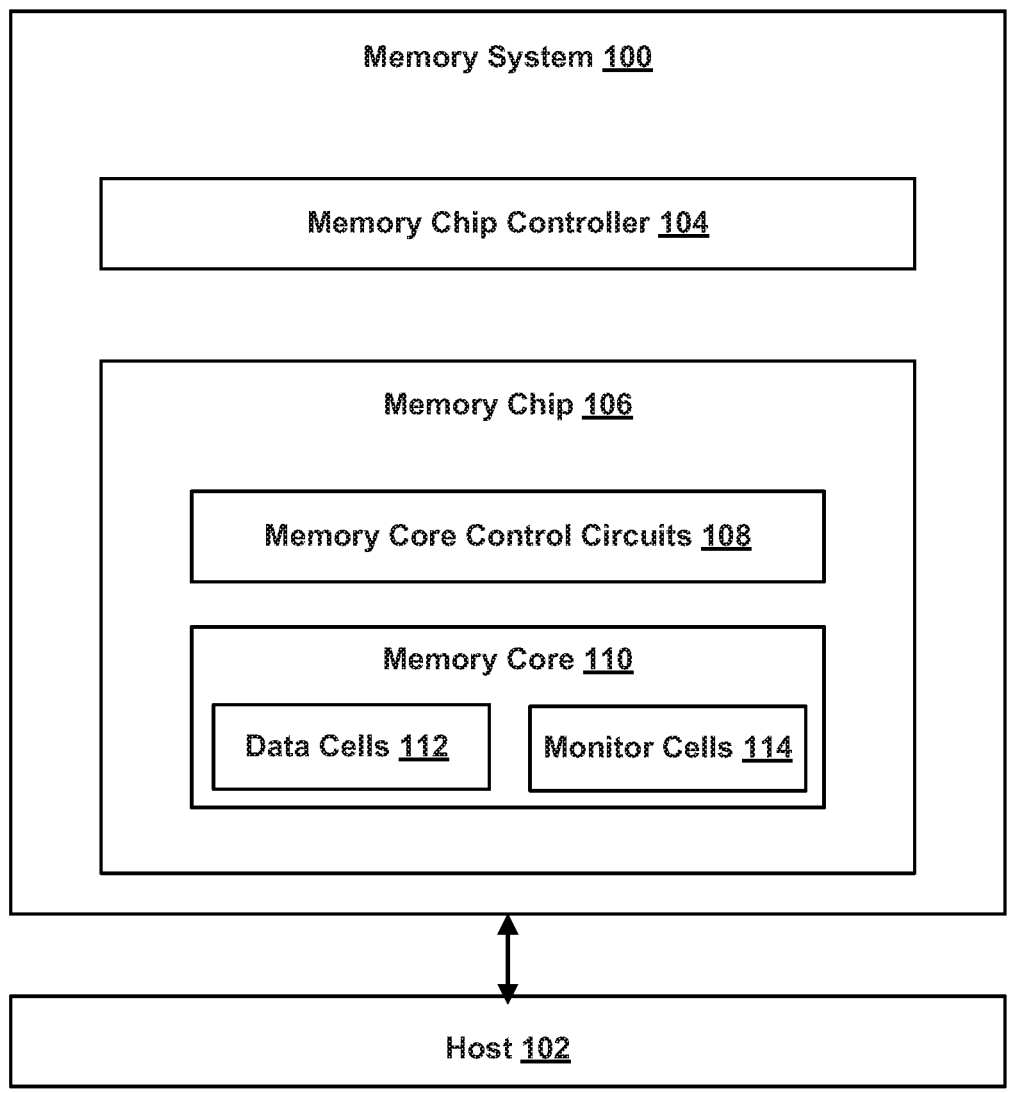
FIG. 1A depicts an embodiment of a memory system and a host.

Technology is described for operating non-volatile storage. Technology is described for identifying non-volatile memory cells having data that should be refreshed, in some embodiments. The technology could be used to identify which groups of memory cells that store cold data should have a data refresh.

In some embodiments, a non-volatile storage device has at least one monitor memory cell associated with a group of data memory cells. The non-volatile storage device may use different programming techniques to program the data and monitor memory cells. In one embodiment, the programming technique used for the monitor memory cell is less stable with respect to state than the technique used to program the associated data memory cells. The state of the monitor memory cell may change in a predictable manner, such that the state of the monitor cell may be sensed periodically to determine whether the associated data memory cells should be refreshed.

In some embodiments, the determination of whether the data memory cells should be refreshed is performed on the memory die that contains the data memory cells. This alleviates the need to have a memory controller determine when the data memory cells should be refreshed. For example, some techniques may use results from an error correction circuit on a memory controller to help decide when data should be refreshed. Note that even if circuitry on the memory die determines that data memory cells should be refreshed, the actual refresh operation could be performed by the controller, or by the memory die.

In some embodiments, the data and monitor memory cells are ReRAM cells. The ReRAM cells may have reversible resistance-switching elements that include a semiconductor material layer and a conductive oxide material layer. Each reversible resistance-switching element may be disposed between a word line and a bit line. Each memory cell may include a barrier material layer between the semiconductor material layer and the conductive oxide material layer. The barrier material layer may have a relatively high oxygen ionic conductivity.

Example barrier modulated switching structures include a semiconductor material layer adjacent a conductive oxide material layer (e.g., an amorphous silicon layer adjacent a titanium oxide layer). Other example barrier modulated switching structures include a thin (e.g., less than about 2 nm) barrier oxide material disposed between the semiconductor material layer and the conductive oxide material layer (e.g., an aluminum oxide layer disposed between an amorphous silicon layer and a titanium oxide layer). As used herein, a memory cell that includes a barrier modulated switching structure is referred to herein as a "barrier modulated cell" (BMC).

In some BMC embodiments, the data and monitor memory cells are BMC resistive ReRAM. In a some BMC ReRAM embodiments, the resistance of a memory element is modulated by separation or recombination of oxygen vacancies and interstitial oxygen ions. When the interstitial oxygen ions combine with the oxygen vacancies, a zone with a low density of charge carriers is formed due to reduction in oxygen vacancies, thereby increasing the resistance of the memory element. This may be referred to as a "resetting" operation. When the interstitial oxygen ion and oxygen vacancy pairs are created due to the separation of the interstitial oxygen ion from the vacancy lattice site, a zone with a high density of charge carriers is formed due to creation of oxygen vacancies, thereby decreasing the resistance of the memory element. This may be referred to as a "setting" operation.

In some embodiments, the data and monitor memory cells are in a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a reversible resistance-switching memory element disposed between first and second conductors. Example reversible resistance-switching memory elements include a phase change material, a ferroelectric material, a metal oxide (e.g., hafnium oxide), a barrier modulated switching structure, or other similar reversible resistance-switching memory elements.

In some embodiments, each memory cell in a cross-point memory array includes a reversible resistance-switching memory element in series with a steering element or an isolation element, such as a diode, to reduce leakage currents. In other cross-point memory arrays, the memory cells do not include an isolation element.

In an embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates.

In some cases, a three-dimensional memory array may include one or more vertical columns of memory cells located above and orthogonal to a substrate. In an example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching memory element without an isolation element in series with the reversible resistance-switching memory element (e.g., no diode in series with the reversible resistance-switching memory element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, and/or control circuitry for controlling reading, programming and erasing of the memory cells). The circuitry associated with the operation of the memory cells may be located above the substrate or within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, sensing, and reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells or one or more three-dimensional arrays of memory cells. In an embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

The memory core 110 has data memory cells 112 and monitor memory cells 114, in one embodiment. Data memory cells 112 may be used to store data, in one embodiment. Monitor memory cells 114 may be used to monitor the data memory cells 112, in one embodiment. In one embodiment, a set of one or more monitor memory cells 114 is associated with a group of the data memory cells 112. This association could be based on the physical location of the monitor and data memory cells. The set of monitor memory cells 114 may be used to monitor the associated group data memory cells 112. The size of the group of data memory cells 112 that are monitored by the set of monitor memory cells 114 can vary. For example, the group of data memory cells 112 might be a byte, physical page, word line, block, or some other unit.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for word lines and bit lines within memory core 110, and generate the appropriate memory block, row, and column addresses.

In some embodiments, one or more managing or control circuits may be used for controlling the operation of a memory array. The one or more managing or control circuits may provide control signals to a memory array to perform an erase operation, a read operation, and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
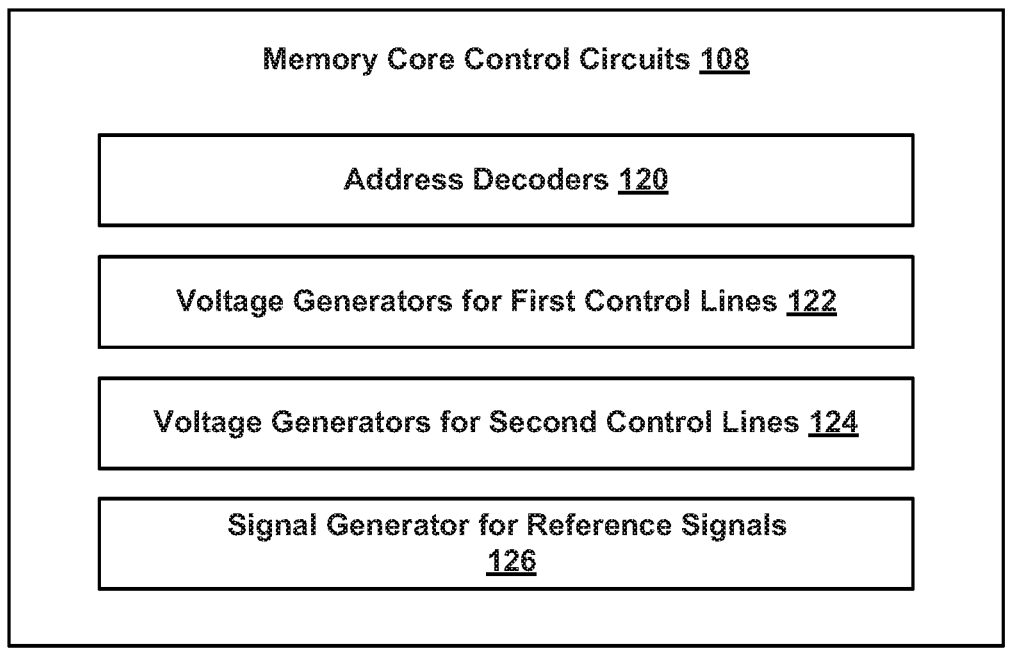
FIG. 1B depicts an embodiment of memory core control circuits.

FIG. 1B depicts one embodiment of memory core control circuits 108. As depicted, memory core control circuits 108 include address decoders 120, voltage generators for first control lines 122, voltage generators for second control lines 124 and signal generators for reference signals 126 (described in more detail below). Control lines may include word lines, bit lines, or a combination of word lines and bit lines. First control lines may include first (e.g., selected) word lines and/or first (e.g., selected) bit lines that are used to place memory cells into a first (e.g., selected) state. Second control lines may include second (e.g., unselected) word lines and/or second (e.g., unselected) bit lines that are used to place memory cells into a second (e.g., unselected) state.

Address decoders 120 may generate memory block addresses, as well as row addresses and column addresses for a particular memory block. Voltage generators (or voltage regulators) for first control lines 122 may include one or more voltage generators for generating first (e.g., selected)

control line voltages. Voltage generators for second control lines 124 may include one or more voltage generators for generating second (e.g., unselected) control line voltages. Signal generators for reference signals 126 may include one or more voltage and/or current generators for generating reference voltage and/or current signals.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
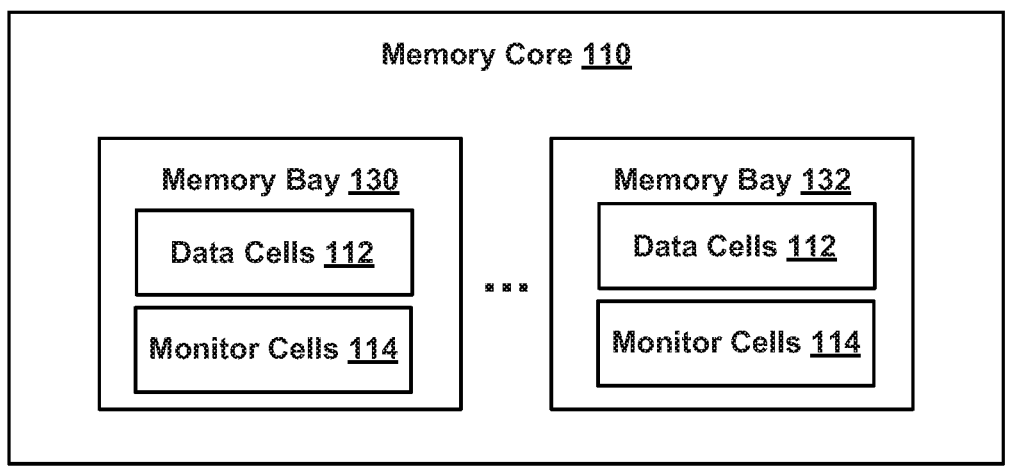
FIG. 1C depicts an embodiment of a memory core.

FIG. 1C depicts an embodiment of memory core 110 of FIG. 1A. As depicted, memory core 110 includes memory bay 130 and memory bay 132. In some embodiments, the number of memory bays per memory core can differ for different implementations. For example, a memory core may include only a single memory bay or multiple memory bays (e.g., 16 or other number of memory bays).

Figure 1D:
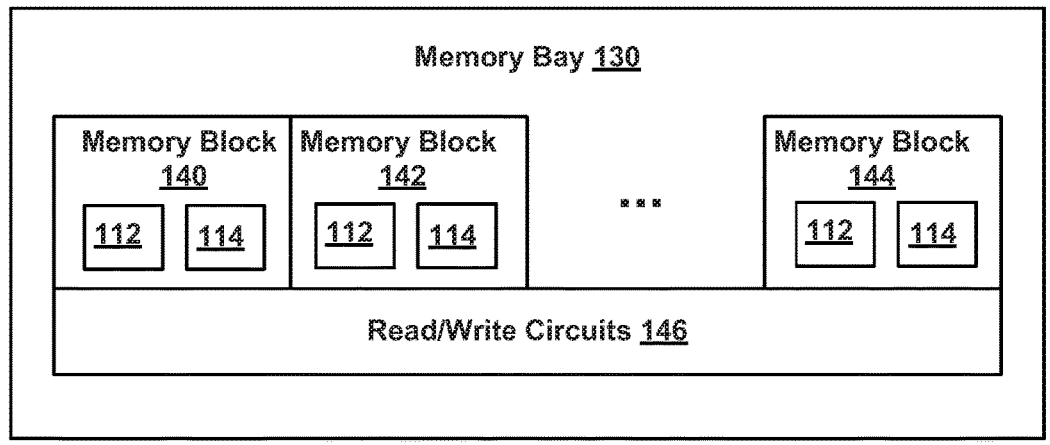
FIG. 1D depicts an embodiment of a memory bay.

FIG. 1D depicts an embodiment of memory bay 130 in FIG. 1C. As depicted, memory bay 130 includes memory blocks 140-144 and read/write circuits 146. In some embodiments, the number of memory blocks per memory bay may differ for different implementations. For example, a memory bay may include one or more memory blocks (e.g., 32 or other number of memory blocks per memory bay). Read/write circuits 146 include circuitry for reading and writing memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In one example, memory system 100 of FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular memory cell to be in one of three or more data/resistance states (i.e., the particular memory cell may include a multi-level memory cell). In one example, read/write circuits 146 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states.

Applying a smaller voltage difference across the particular memory cell may cause the particular memory cell to be partially programmed or programmed at a slower rate than when applying a larger voltage difference. In another example, read/write circuits 146 may apply a first voltage difference across the particular memory cell for a first time period to program the particular memory cell into a first state of the three or more data/resistance states, and apply the first voltage difference across the particular memory cell for a second time period less than the first time period. One or more programming pulses followed by a memory cell verification phase may be used to program the particular memory cell to be in the correct state.

Figure 1E:
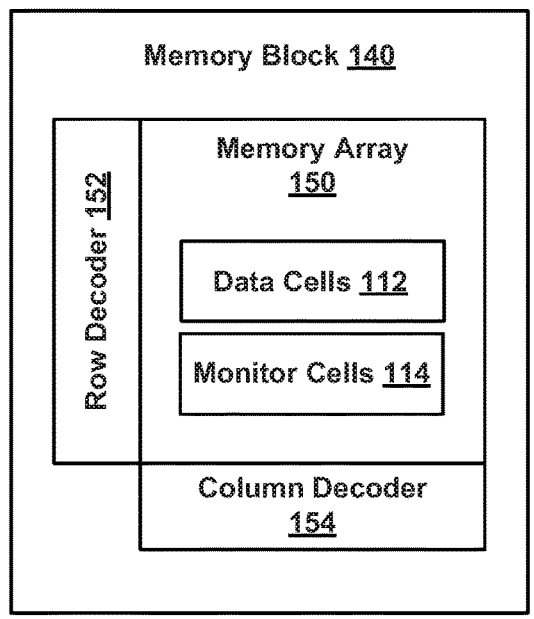
FIG. 1E depicts an embodiment of a memory block.

FIG. 1E depicts an embodiment of memory block 140 in FIG. 1D. As depicted, memory block 140 includes a memory array 150, row decoder 152, and column decoder 154. Memory array 150 may include a contiguous group of memory cells having contiguous word lines and bit lines. Memory array 150 may include one or more layers of memory cells. Memory array 150 may include a two-dimensional memory array or a three-dimensional memory array.

Row decoder 152 decodes a row address and selects a particular word line in memory array 150 when appropriate (e.g., when reading or writing memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is 4, providing a memory array 150 containing 16M memory cells.

Figure 1F:
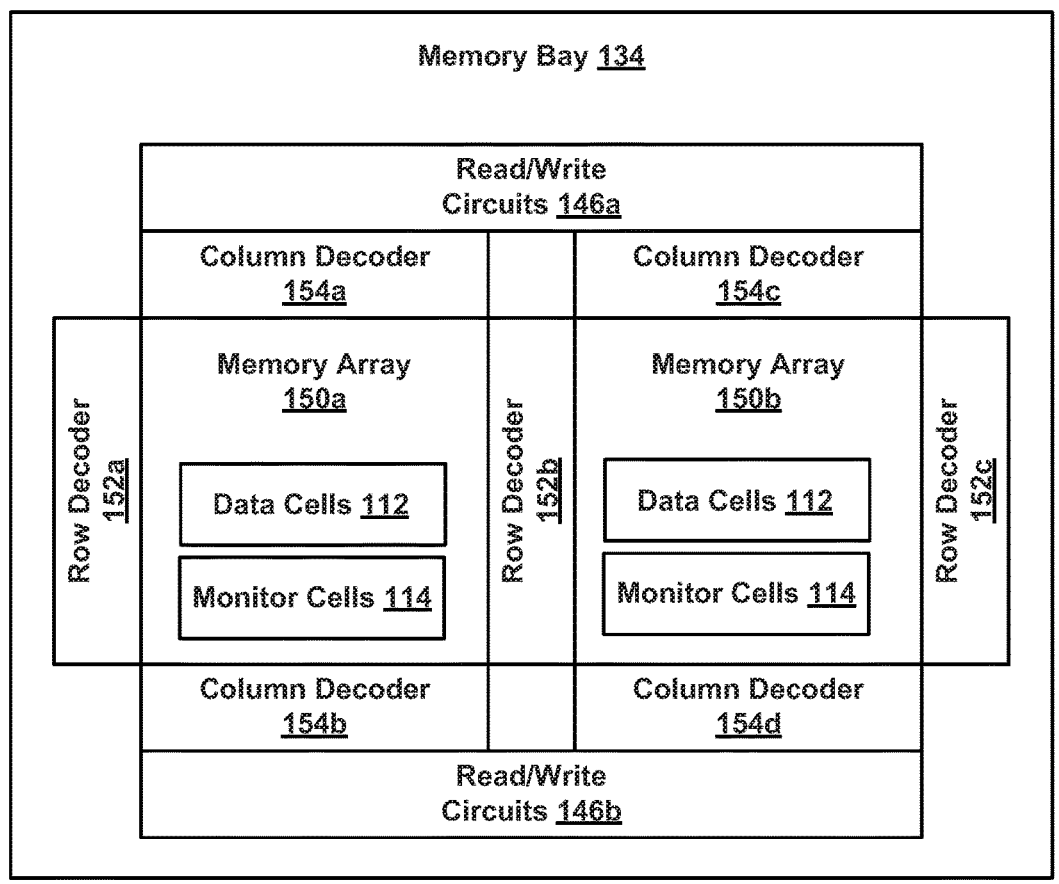
FIG. 1F depicts another embodiment of a memory bay.

FIG. 1F depicts an embodiment of a memory bay 134. Memory bay 134 is an alternative example implementation for memory bay 130 of FIG. 1D. In some embodiments, row decoders, column decoders, and read/write circuits may be split or shared between memory arrays. As depicted, row decoder 152*b* is shared between memory arrays 150*a* and 150*b* because row decoder 152*b* controls word lines in both memory arrays 150*a* and 150*b* (i.e., the word lines driven by row decoder 152*b* are shared).

Row decoders 152*a* and 152*b* may be split such that even word lines in memory array 150*a* are driven by row decoder 152*a* and odd word lines in memory array 150*a* are driven by row decoder 152*b*. Row decoders 152*c* and 152*b* may be split such that even word lines in memory array 150*b* are driven by row decoder 152*c* and odd word lines in memory array 150*b* are driven by row decoder 152*b*.

Column decoders 154*a* and 154*b* may be split such that even bit lines in memory array 150*a* are controlled by column decoder 154*b* and odd bit lines in memory array 150*a* are driven by column decoder 154*a*. Column decoders 154*c* and 154*d* may be split such that even bit lines in memory array 150*b* are controlled by column decoder 154*d* and odd bit lines in memory array 150*b* are driven by column decoder 154*c*.

The selected bit lines controlled by column decoder 154*a* and column decoder 154*c* may be electrically coupled to read/write circuits 146*a*. The selected bit lines controlled by column decoder 154*b* and column decoder 154*d* may be electrically coupled to read/write circuits 146*b*. Splitting the read/write circuits into read/write circuits 146*a* and 146*b* when the column decoders are split may allow for a more efficient layout of the memory bay.

Figure 2A:
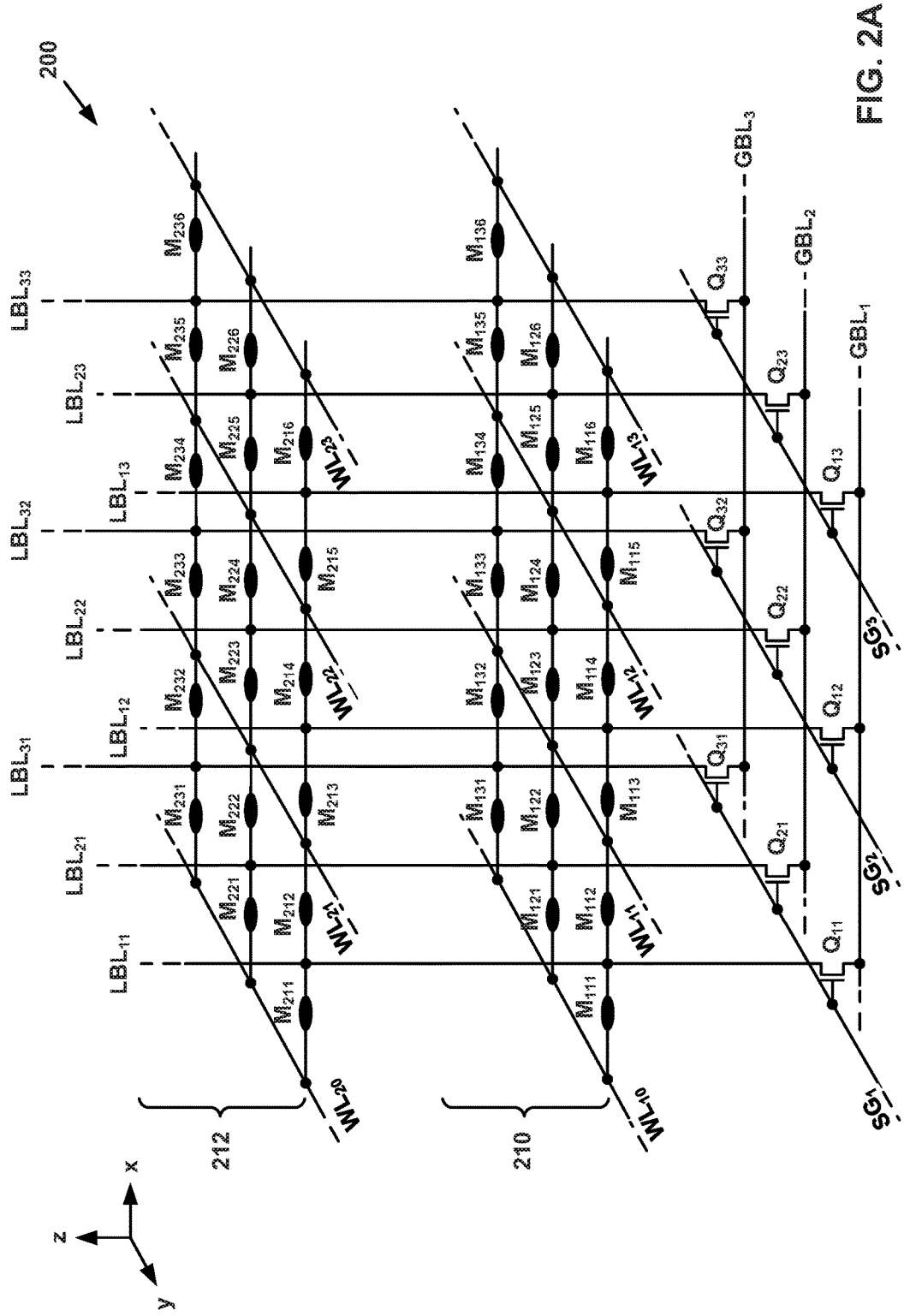
FIG. 2A depicts an embodiment of a portion of a monolithic three-dimensional memory array.

FIG. 2A depicts one embodiment of a portion of a monolithic three-dimensional memory array 200 that includes a first memory level 210, and a second memory level 212 positioned above first memory level 210. Memory array 200 is one example of an implementation for memory array 150 of FIG. 1E. Local bit lines $LBL_{11}$-$LBL_{33}$ are arranged in a first direction (e.g., a vertical or z-direction) and word lines $WL_{10}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

As depicted, disposed between the intersection of each local bit line and each word line is a particular memory cell (e.g., memory cell $M_{111}$ is disposed between local bit line $LBL_{11}$ and word line $WL_{10}$). The particular memory cell may include a floating gate memory element, a charge trap memory element (e.g., using a silicon nitride material), a reversible resistance-switching memory element, or other similar device. The global bit lines $GBL_1$-$GBL_3$ are arranged in a third direction (e.g., a y-direction) that is perpendicular to both the first direction and the second direction.

Some of the memory cells are used to store data, and are referred to as data memory cells. Other memory cells are used to monitor a group of the data memory cells, and are referred to as monitor memory cells.

Each local bit line $LBL_{11}$-$LBL_{33}$ has an associated bit line select transistor $Q_{11}$-$Q_{33}$, respectively. Bit line select transistors $Q_{11}$-$Q_{33}$ may be field effect transistors, such as shown, or may be any other transistors. As depicted, bit line select transistors $Q_{11}$-$Q_{31}$ are associated with local bit lines $LBL_{11}$-$LBL_{31}$, respectively, and may be used to connect local bit lines $LBL_{11}$-$LBL_{31}$ to global bit lines $GBL_1$-$GBL_3$, respectively, using row select line $SG_1$. In particular, each of bit line select transistors $Q_{11}$-$Q_{31}$ has a first terminal (e.g., a drain/source terminal) coupled to a corresponding one of local bit lines $LBL_{11}$-$LBL_{31}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_1$.

Similarly, bit line select transistors $Q_{12}$-$Q_{32}$ are associated with local bit lines $LBL_{12}$-$LBL_{32}$, respectively, and may be used to connect local bit lines $LBL_{12}$-$LBL_{32}$ to global bit lines $GBL_1$-$GBL_3$, respectively, using row select line $SG_2$. In particular, each of bit line select transistors $Q_{12}$-$Q_{32}$ has a first terminal (e.g., a drain/source terminal) coupled to a corresponding one of local bit lines $LBL_{12}$-$LBL_{32}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_2$.

Likewise, bit line select transistors $Q_{13}$-$Q_{33}$ are associated with local bit lines $LBL_{13}$-$LBL_{33}$, respectively, and may be used to connect local bit lines $LBL_{13}$-$LBL_{33}$ to global bit lines $GBL_1$-$GBL_3$, respectively, using row select line $SG_3$. In particular, each of bit line select transistors $Q_{13}$-$Q_{33}$ has a first terminal (e.g., a drain/source terminal) coupled to a corresponding one of local bit lines $LBL_{13}$-$LBL_{33}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_3$.

Because a single bit line select transistor is associated with a corresponding local bit line, the voltage of a particular global bit line may be selectively applied to a corresponding local bit line. Therefore, when a first set of local bit lines (e.g., $LBL_{11}$-$LBL_{31}$) is biased to global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated.

In an embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In an embodiment, a vertical bit line memory array, such as memory array 200, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, whereas the number of memory cells along each word line may be 2048 or more than 4096. Other numbers of memory cells along each bit line and along each word line may be used.

In an embodiment of a read operation, the data stored in a selected memory cell (e.g., memory cell $M_{111}$) may be read by biasing the word line connected to the selected memory cell (e.g., selected word line $WL_{10}$) to a selected word line voltage in read mode (e.g., 0V). The local bit line (e.g., $LBL_{11}$) coupled to the selected memory cell ($M_{111}$) is biased to a selected bit line voltage in read mode (e.g., 1 V) via the associated bit line select transistor (e.g., $Q_{11}$) coupled to the selected local bit line ($LBL_{11}$), and the global bit line (e.g., $GBL_1$) coupled to the bit line select transistor ($Q_{11}$). A sense amplifier may then be coupled to the selected local bit line ($LBL_{11}$) to determine a read current $I_{READ}$ of the selected memory cell ($M_{111}$). The read current $I_{READ}$ is conducted by the bit line select transistor $Q_{11}$, and may be between about 100 nA and about 500 nA, although other read currents may be used.

In an embodiment of a write operation, data may be written to a selected memory cell (e.g., memory cell $M_{221}$) by biasing the word line connected to the selected memory cell (e.g., $WL_{20}$) to a selected word line voltage in write mode (e.g., 5V). The local bit line (e.g., $LBL_{21}$) coupled to the selected memory cell ($M_{221}$) is biased to a selected bit line voltage in write mode (e.g., 0 V) via the associated bit line select transistor (e.g., $Q_{21}$) coupled to the selected local bit line ($LBL_{21}$), and the global bit line (e.g., $GBL_2$) coupled to the bit line select transistor ($Q_{21}$). During a write operation, a programming current $I_{PGRM}$ is conducted by the associated bit line select transistor $Q_{21}$, and may be between about 3 uA and about 6 uA, although other programming currents may be used.

During the write operation described above, the word line (e.g., $WL_{20}$) connected to the selected memory cell ($M_{221}$) may be referred to as a "selected word line," and the local bit line (e.g., $LBL_{21}$) coupled to the selected memory cell ($M_{221}$) may be referred to as the "selected local bit line." All other word lines coupled to unselected memory cells may be referred to as "unselected word lines," and all other local bit lines coupled to unselected memory cells may be referred to as "unselected local bit lines." For example, if memory cell $M_{221}$ is the only selected memory cell in memory array 200, word lines $WL_{10}$-$WL_{13}$ and $WL_{21}$-$WL_{23}$ are unselected word lines, and local bit lines $LBL_{11}$, $LBL_{31}$, $LBL_{12}$-$LBL_{32}$, and $LBL_{13}$-$LBL_{33}$ are unselected local bit lines.

Figure 2B:
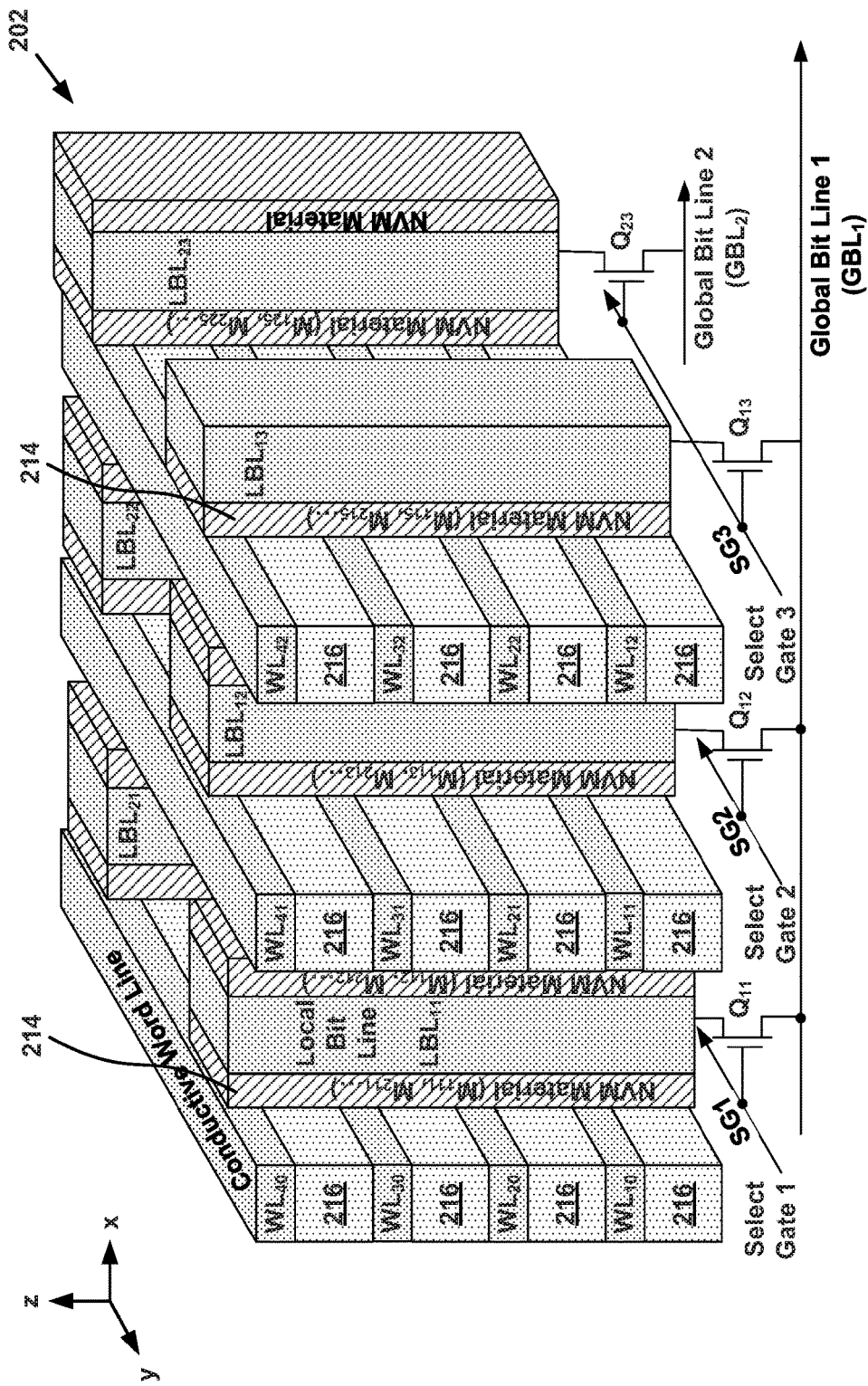
FIG. 2B depicts an embodiment of a portion of a monolithic three-dimensional memory array that includes vertical strips of a non-volatile memory material.

FIG. 2B depicts an embodiment of a portion of a monolithic three-dimensional memory array 202 that includes vertical strips of a non-volatile memory material. The portion of monolithic three-dimensional memory array 202 depicted in FIG. 2B may include an implementation for a portion of the monolithic three-dimensional memory array 200 depicted in FIG. 2A.

Monolithic three-dimensional memory array 202 includes word lines $WL_{10}$, $WL_{11}$, $WL_{12}$, ..., $WL_{42}$ that are formed in a first direction (e.g., an x-direction), vertical bit lines $LBL_{11}$, $LBL_{12}$, $LBL_{13}$, ..., $LBL_{23}$ that are formed in a second direction perpendicular to the first direction (e.g., a z-direction), and vertical strips of non-volatile memory material 214 formed in the second direction (e.g., the z-direction). A spacer 216 made of a dielectric material (e.g., silicon dioxide, silicon nitride, or other dielectric material) is disposed between adjacent word lines $WL_{10}$, $W_{11}$, $WL_{12}$, ..., $WL_{42}$.

Each vertical strip of non-volatile memory material 214 may include, for example, a vertical oxide material, a vertical reversible resistance-switching memory material (e.g., one or more metal oxide layers such as nickel oxide, hafnium oxide, or other similar metal oxide materials, a phase change material, a barrier modulated switching structure or other similar reversible resistance-switching memory material), a ferroelectric material, or other non-volatile memory material.

Each vertical strip of non-volatile memory material 214 may include a single material layer or multiple material layers. In an embodiment, each vertical strip of non-volatile memory material 214 includes a vertical barrier modulated switching structure. Example barrier modulated switching structures include a semiconductor material layer adjacent a conductive oxide material layer (e.g., an amorphous silicon layer adjacent a titanium oxide layer). Other example barrier modulated switching structures include a barrier material disposed between the semiconductor material layer and the conductive oxide material layer (e.g., an aluminum oxide layer disposed between an amorphous silicon layer and a titanium oxide layer). Such multi-layer embodiments may be used to form BMC memory elements.

In an embodiment, each vertical strip of non-volatile memory material 214 may include a single continuous layer of material that may be used by a plurality of memory cells or devices.

In an embodiment, portions of the vertical strip of the non-volatile memory material 214 may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure).

As depicted, each of the vertical bit lines $LBL_{11}$, $LBL_{12}$, $LBL_{13}$, ..., $LBL_{23}$ may be connected to one of a set of global bit lines via an associated vertically-oriented bit line select transistor (e.g., $Q_{11}$, $Q_{12}$, $Q_{13}$, $Q_{23}$). Each vertically-oriented bit line select transistor may include a MOS device (e.g., an NMOS device) or a vertical thin-film transistor (TFT).

In an embodiment, each vertically-oriented bit line select transistor is a vertically-oriented pillar-shaped TFT coupled between an associated local bit line pillar and a global bit line. In an embodiment, the vertically-oriented bit line select transistors are formed in a pillar select layer formed above a CMOS substrate, and a memory layer that includes multiple layers of word lines and memory elements is formed above the pillar select layer.

Figure 2C:
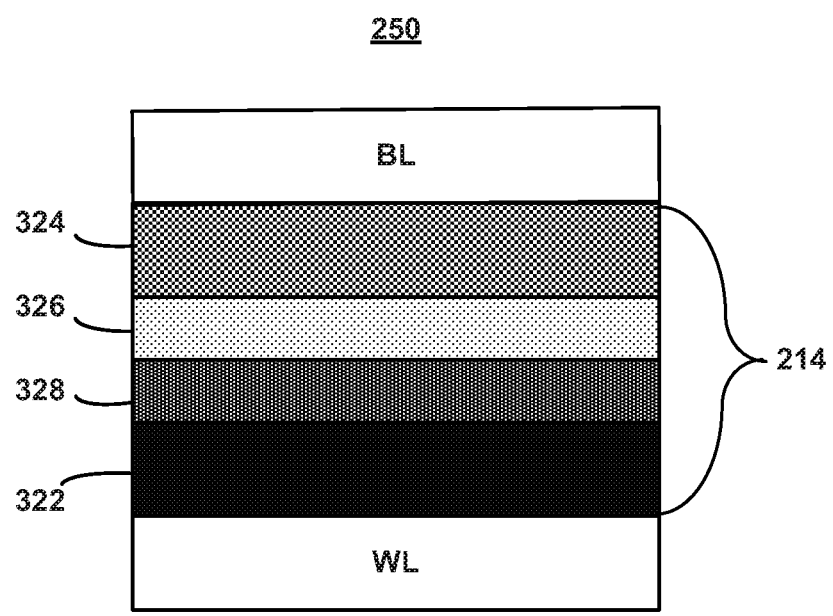
FIG. 2C is a diagram of one embodiment of a ReRAM memory cell.

FIG. 2C is a diagram of one embodiment of a ReRAM cell 250. The cell 250 may be used in structure 202 in FIG. 2B, but is not limited thereto. Also, the structure 202 in FIG. 2B is not limited to the ReRAM cell 250 of FIG. 2C. The ReRAM cell 250 may be referred to as a barrier modulated cell (BMC).

The ReRAM cell 250 has non-volatile memory material 214 sandwiched between a portion of a bit line (BL) and a portion of a word line (WL). Note that the bit line can be a local bit line (LBL) in the structure of FIG. 2B. Memory material 214 includes a barrier modulated switching structure that includes a semiconductor material layer 322, a conductive oxide material layer 324, and a barrier material layer 326 disposed between the semiconductor material layer 322 and the conductive oxide material layer 324. In an embodiment, the non-volatile memory material 214 also includes a reactive layer 328 that forms as a result of semiconductor material layer 322 reacting with oxygen from barrier material layer 326. Thus, the reactive layer 328 is optional.

In one embodiment, barrier material layer 326 includes a material with a relatively high ionic conductivity. In one embodiment, barrier material layer 326 includes a material having an ionic conductivity of greater than about 0.1 Siemens/cm @1000° C., although materials with other ionic conductivities may be used.

In embodiments, barrier material layer 326 may be one or more of cerium-doped zirconium oxide, cerium oxide, gadolinium doped ceria, hafnium oxide, lanthanum oxide, lanthanum cobalt oxide, lanthanum gallium oxide, lanthanum germanium oxide, lanthanum manganese oxide, lanthanum molybdenum oxide, lanthanum silicon oxide, lanthanum-doped titanium oxide, praseodymium calcium manganese oxide, scandium-stabilized zirconia, strontium titanate, tantalum oxide, and yttria-stabilized zirconia, although other materials may be used. In embodiments, barrier material layer 326 may be doped (e.g., with metal ions) or undoped. In embodiments, barrier material layer 326 has a thickness between about 0.5 nm and about 4 nm, although other thicknesses may be used.

Figure 3:
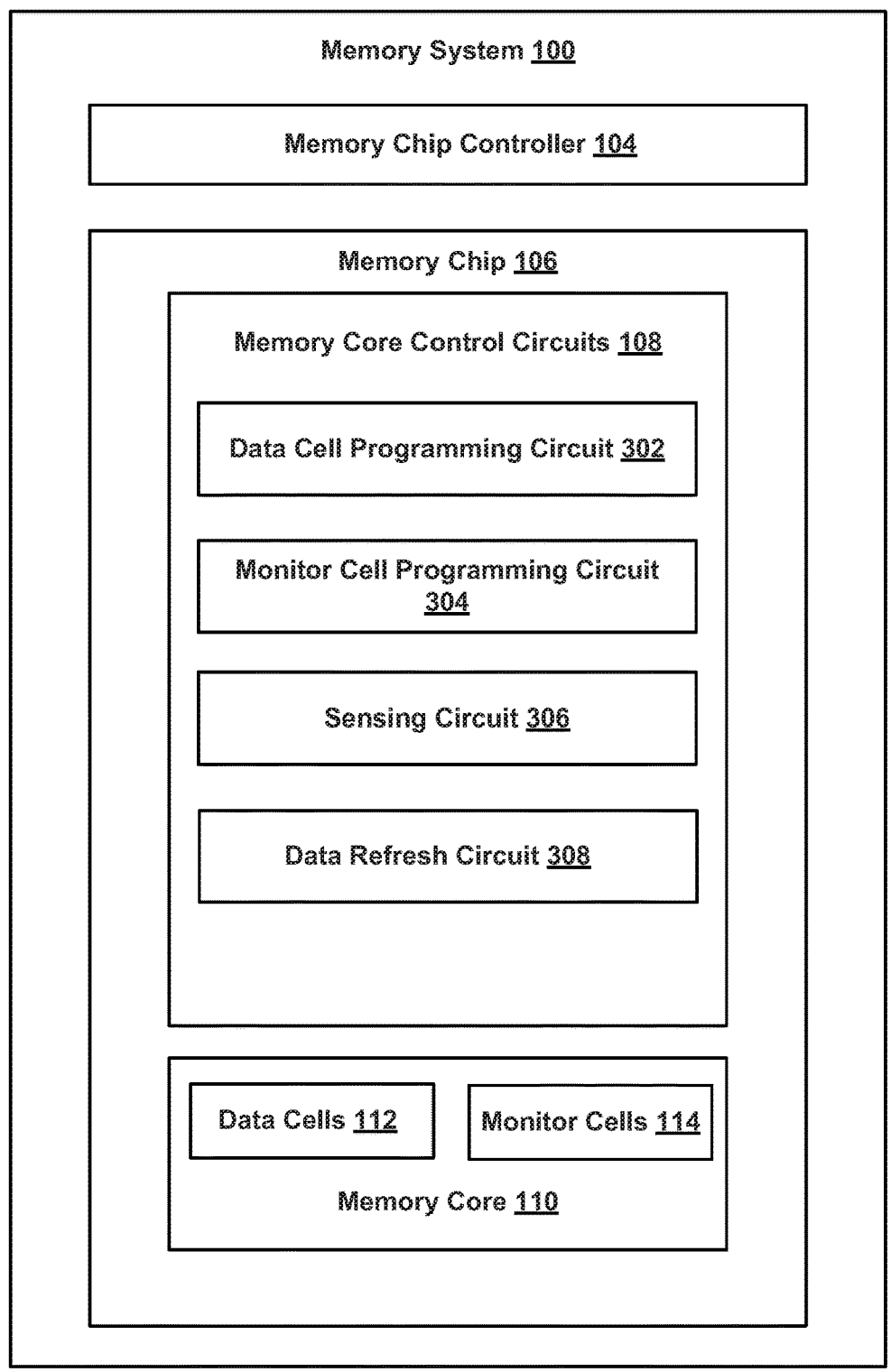
FIG. 3 is a diagram of one embodiment of a non-volatile memory system.

FIG. 3 is a diagram of one embodiment of a non-volatile memory system 100. The memory core 110 has data memory cells 112 and monitor memory cells 114. The data memory cells 112 and monitor memory cells 114 may be physically the same. The data memory cells 112 and monitor memory cells 114 may each be ReRAM cells. In some embodiments, the data memory cells 112 and monitor memory cells 114 are each BMCs. The memory core control circuits 108 have a data cell programming circuit 302, a monitor cell programming circuit 304, a sensing circuit 306, and a data refresh circuit 308.

The data cell programming circuit 302 is configured to program non-volatile memory cells using a first programming technique. In one embodiment, the data cell programming technique results in a relatively stable state retention in the memory cells. In one embodiment, the data cell programming circuit 302 is used to program the data memory cells 112.

Data cell programming circuit 302 may include one or more of address decoders 120, voltage generators for first control lines 122, voltage generators for second control lines 124, signal generator for reference signals 126, row decoders 152, column decoder 154, read/write circuits 146, state machine, sense amplifiers and/or other hardware or software.

The monitor cell programming circuit 304 is configured to program non-volatile memory cells using a second programming technique. In one embodiment, the monitor cell programming technique results in a less stable state retention than the data cell programming technique. In one embodiment, the monitor cell programming circuit 304 is used to program the monitor memory cells 114.

Monitor cell programming circuit 304 may include one or more of address decoders 120, voltage generators for first control lines 122, voltage generators for second control lines 124, signal generator for reference signals 126, row decoders 152, column decoder 154, read/write circuits 146, state machine, sense amplifiers and/or other hardware or software.

The sensing circuit 306 is configured to sense a condition of non-volatile memory cells in the memory core 110. In one embodiment, the sensing circuit 306 is configured to sense a current of a monitor memory cell 114 and determine whether the current is beyond a threshold. In one embodiment, the sensing circuit 306 is configured to sense a resistance of a monitor memory cell 114 and determine whether the resistance is beyond a threshold.

Sensing circuit 306 may include one or more of address decoders 120, voltage generators for first control lines 122, voltage generators for second control lines 124, signal generator for reference signals 126, row decoders 152, column decoder 154, read/write circuits 146, state machine, sense amplifiers and/or other hardware or software.

The data refresh circuit 308 is configured to refresh data in the data memory cells 112. In one embodiment, the data refresh circuit 308 refreshes data in a group of data memory cells 112 that are associated with a monitor memory cell 114 whose current went beyond a threshold. The data refresh circuit 308 may refresh in place by re-programming the data in the same group of memory cells. Alternatively, the data refresh circuit 308 may move the data to another group of memory cells. The other group of memory cells could be in the memory core 110, but is not required to be within the memory core 110. All or a portion of the data refresh circuit 308 could be located on the memory chip controller 104.

Data refresh circuit 308 may include one or more of address decoders 120, voltage generators for first control lines 122, voltage generators for second control lines 124, signal generator for reference signals 126, row decoders 152, column decoder 154, read/write circuits 146, state machine, sense amplifiers and/or other hardware or software.

Figure 4A:
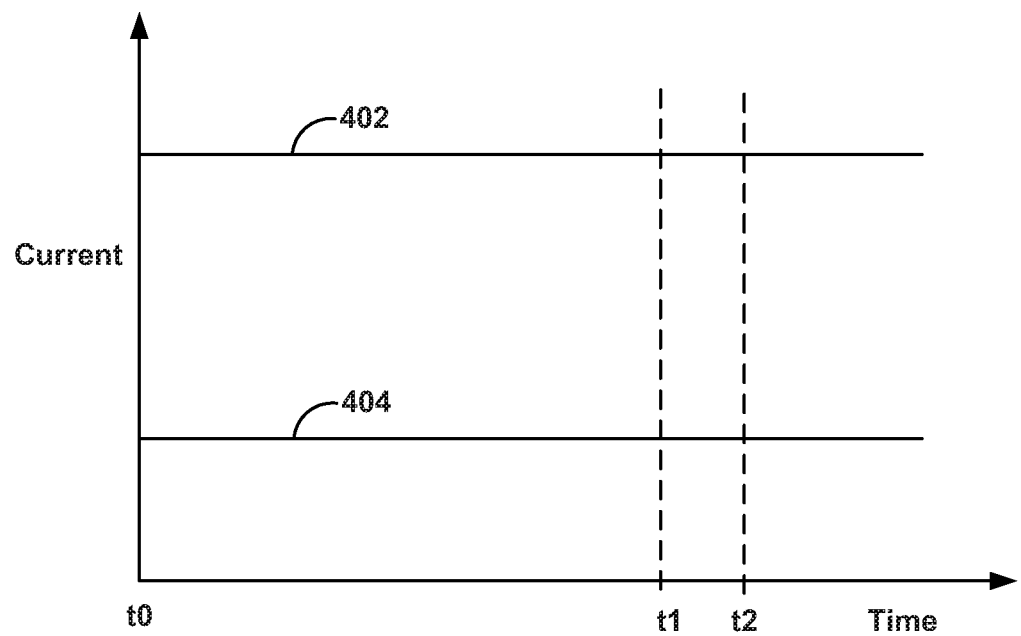
FIG. 4A depicts current versus time relationship for one embodiment of a programming technique for data memory cells.

FIG. 4A depicts current versus time relationship for one embodiment of a programming technique for data memory cells 112. The data memory cells 112 may be ReRAM cells. The data memory cells 112 may be BMCs. However, other types of memory cells 112 may also be programmed to exhibit the current versus time relationship in FIG. 4A. The time-axis represents time since the memory cells were last programmed. Thus, the memory cells were programmed at time t0. The times t1 and t2 represent times that the data memory cells 112 might be marked for a data refresh, as will be discussed below. For the sake of discussion, the data in these memory cells will be referred to as cold data due to the relatively long time between t0 and t1. Note that the length of time to be considered cold data can vary considerably depending on factors such as the stability of the state of the data memory cells 112.

Line 402 depicts a current versus time relationship for a low resistance state for data memory cells 112, which were programmed using one embodiment of a data cell programming technique. Line 404 depicts a current versus time relationship for a high resistance state for data memory cells 112, which were programmed using one embodiment of a data cell programming technique. Each line 402, 404 is relatively stable over time, at least for the range at around time t1. Thus, the state of the data memory cells 112 is quite stable over time.

Figure 4B:
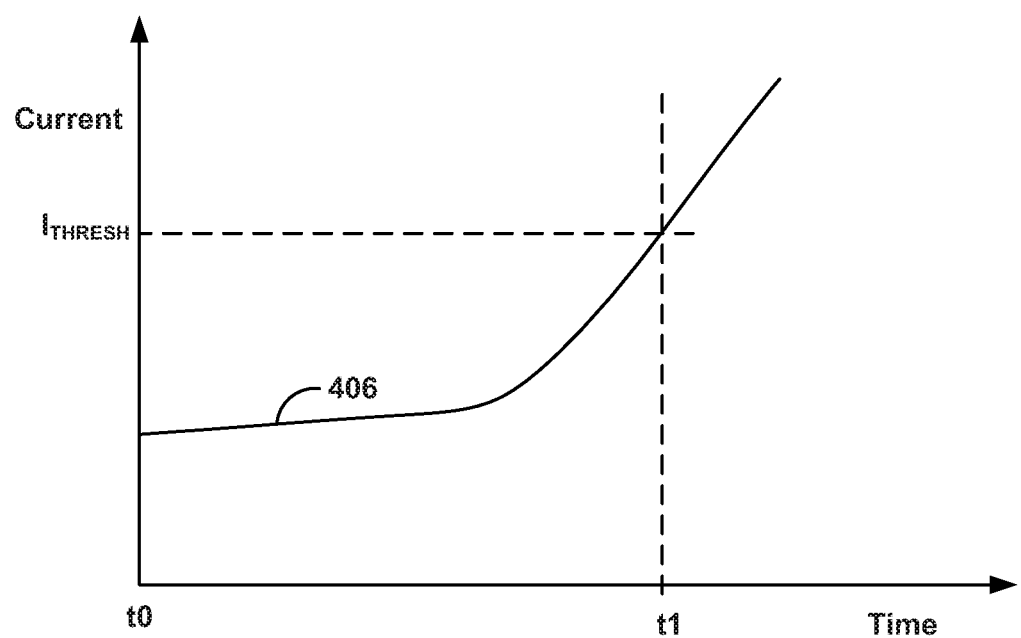
FIGS. 4B, 4C, and 4D depict current versus time relationships for embodiments of programming techniques for monitor memory cells.

FIG. 4B depicts current versus time relationship for one embodiment of a programming technique for monitor memory cells 114. The monitor memory cells 114 may be ReRAM cells. The monitor memory cells 114 may be BMCs. However, other types of memory cells 112 may also be programmed to exhibit the current versus time relationship in FIG. 4B. Line 406 depicts a current versus time relationship for a high resistance (low current) state for monitor memory cells 114, which were programmed using one embodiment of a monitor cell programming technique. The current changes at a significantly faster rate than for the high resistance state for the programming technique used for data memory cells 112 (see FIG. 4A). Stated another way, the state of the monitor memory cells 114 is less stable that the state of the data memory cells 112. Note that this difference in stability of the state is due to differences in the programming techniques, as opposed to differences in physical properties of the data and monitor memory cells.

In example of FIG. 4B, the current increases only slightly at first. However, as the time nears time t1, the current begins to increase at a much faster rate. By time t1, the current has reached a threshold current ($I_{THRESH}$). In one embodiment, the sensing circuit 306 determines whether the current in a monitor cell 114 crosses the threshold current. In response to the current crossing the threshold current, the group of data memory cells associated with the monitor memory cell 114 may be marked for a data refresh. At some point in time, the data refresh circuit 308 may refresh the data in the group of data memory cells. Note that the state of the monitor cell 114 is less stable than the state of the associated data memory cells 112.

Figure 4C:
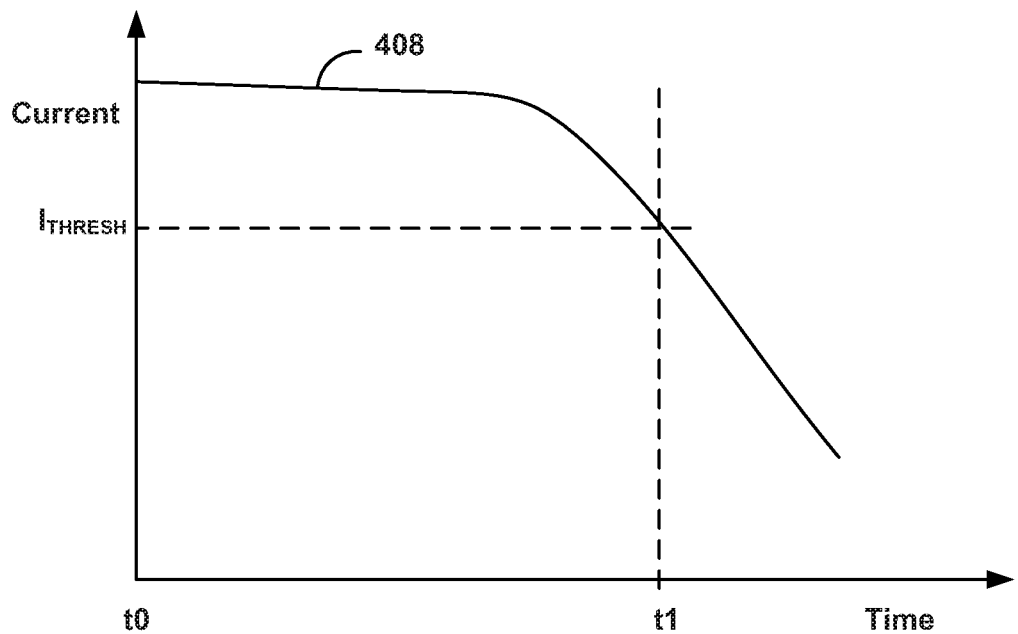

FIG. 4C depicts current versus time curves for one embodiment of a programming technique for monitor memory cells 114. The monitor memory cells 114 may be ReRAM cells. The monitor memory cells 114 may be BMCs. However, other types of memory cells may also be programmed to exhibit the current versus time relationship in FIG. 4C. Line 408 depicts a current versus time relationship for a low resistance (high current) state for monitor memory cells 114, which were programmed using one embodiment of a monitor cell programming technique. The current changes at a significantly faster rate than for the low resistance state for the programming technique used for data memory cells 112 shown in FIG. 4A. In this example, the current decreases only slightly at first. However, as the time nears time t1, the current begins to decrease at a much faster rate. By time t1, the current has reached a threshold current ($I_{THRESH}$). In one embodiment, the sensing circuit 306 determines whether the current in the monitor cells 114 crosses the threshold current. In response to the current crossing the threshold current, the group of data memory cells associated with the monitor memory cell 114 may be tagged. At some point in time, the data refresh circuit 308 may refresh the data in the group of data memory cells.

Note that the state of the monitor memory cells (as well as the state of the data memory cells) may be impacted by factors other than time. For example, the state may be impacted by temperature. Various signals in the memory array could also impact the state of a memory cell. For example, when a memory cell is read, the voltages applied to the memory cell, current through the memory cell, etc. could conceivably have some impact on the state. Other factors may also impact the state of a memory cell.

Figure 4D:
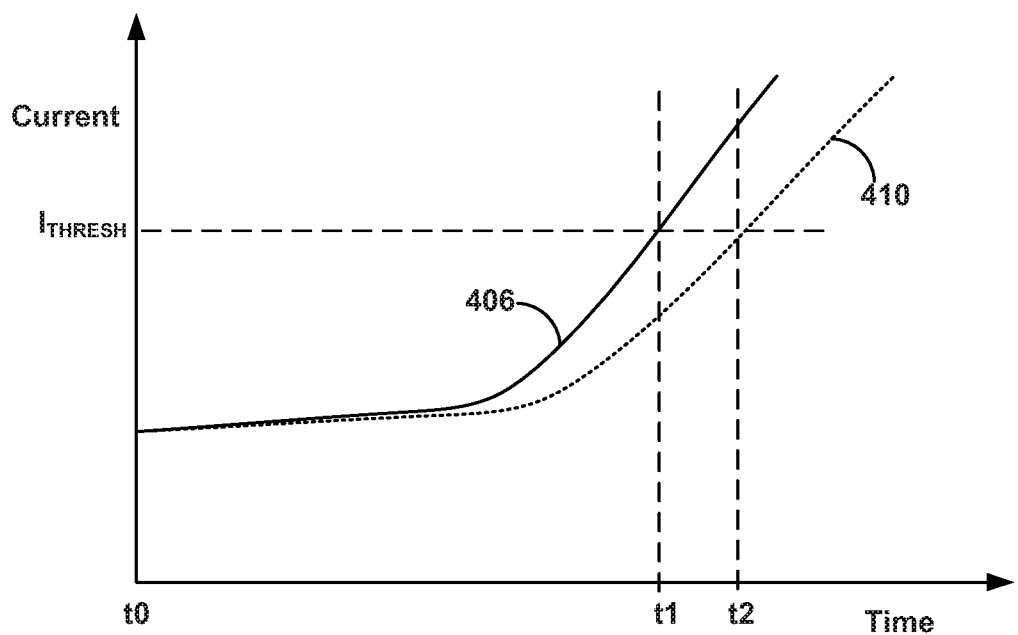

FIG. 4D is a diagram that adds line 410 to the example from FIG. 4B to show a second current versus time relationship. The monitor memory cells 114 may be ReRAM cells. The monitor memory cells 114 may be BMCs. However, other types of memory cells may also be programmed to exhibit the current versus time relationship in FIG. 4D. Lines 406 and 410 represent different temperature conditions. Note the line 410 takes a longer time than line 406 to cross $I_{THRESH}$. Thus, for the conditions pertaining to line 410, the associated data memory cells could be marked for refresh at time t2. Note that the monitor memory cells 114 may automatically factor in the additional factor of temperature, as the data memory cells 112 may be exposed to the same temperature as the monitor memory cells. Likewise, the monitor memory cells may automatically factor in other conditions such as worst case impact of signals in the memory array.

Figure 5:
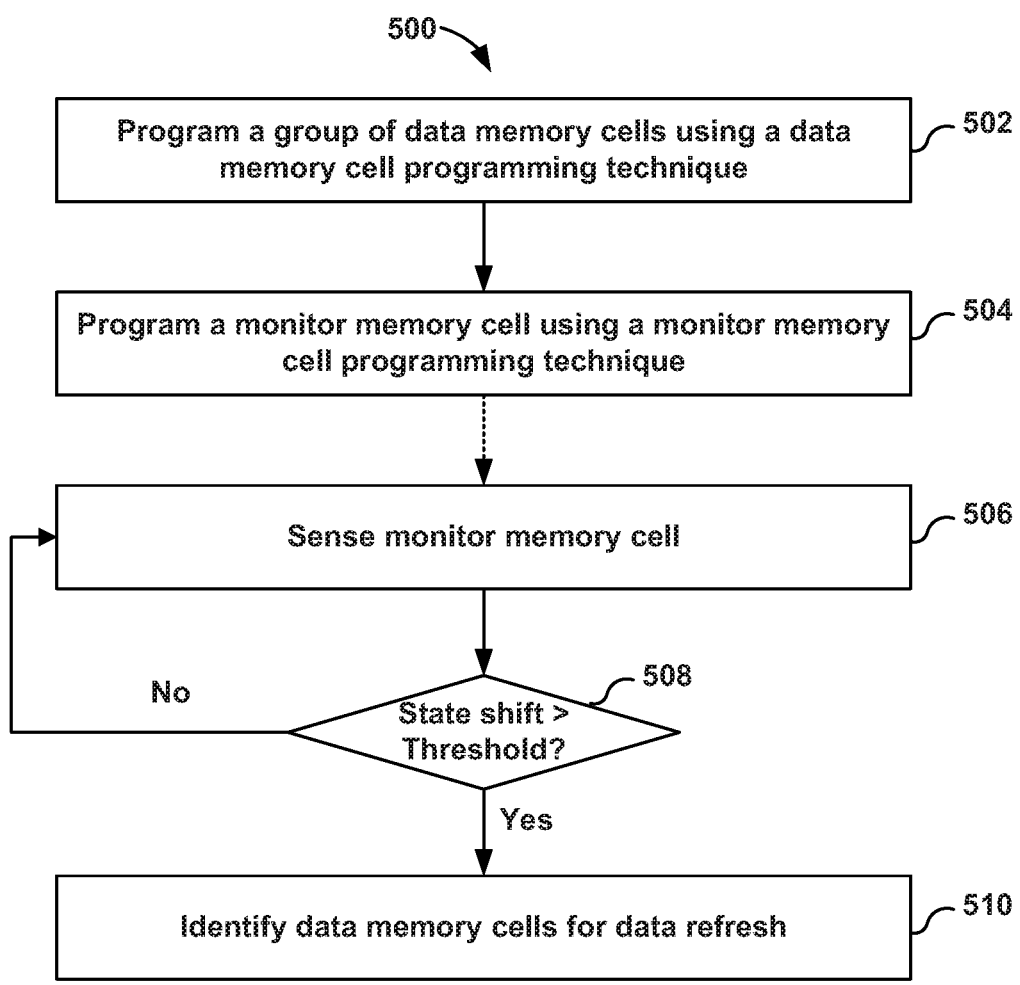
FIG. 5 is a flowchart of one embodiment of a process of operating non-volatile storage.

FIG. 5 is a flowchart of one embodiment of a process 500 of operating non-volatile storage. The process 500 may be performed in memory system 100 of FIG. 1A or 3, as examples. In one embodiment, process 500 is performed on a memory die, such as memory chip 106 in FIG. 1A or 3. Steps 502 and 504 of process 500 may be performed in response to a request from host to store data in the memory system 100.

Step 502 includes programming data into a group of data memory cells 112 using a data memory cell programming technique. The data memory cells may be ReRAM cells. In some embodiments, the data memory cells 112 are BMCs. However, the data memory cells are not limited to either ReRAM, or BMC memory cells.

Step 504 includes programming data into a set of one or more monitor memory cells 114 using a monitor memory cell programming technique. The monitor memory cells may be ReRAM cells. In some embodiments, the monitor memory cells 114 are BMCs. However, the monitor memory cells are not limited to either ReRAM, BMC memory cells.

Step 504 is performed in parallel with step 502, in one embodiment. For example, suitable program voltages may be applied concurrently to both the data memory cells 112 and monitor memory cells 114. However, parallel programming is not required. In other words, it is not required that the program voltage be applied to the monitor memory cell 114 while a program voltage is applied to any of the data memory cells 112. Also note that in some cases not all of the data memory cells 112 are programmed in parallel. In one embodiment, the data and monitor cells are programmed contemporaneously. Programming the data and monitor cells contemporaneously means that they are programmed at about the same time. Programming at "contemporaneously" (or "at about the same time") as defined relative to how much time typically transpires between programming and the need to refresh data in the data memory cells. In one embodiment, contemporaneous programming is met if the time gap between programming the monitor cell 114 and the associated data memory cells 112 is less than 1% of the typical time to refresh the data in the data memory cells 112.

Step 506 includes sensing the set of monitor memory cells 114. There is a dashed line between step 504 and 506 to indicate that considerable time may pass between step 504 and 506. In one embodiment, step 506 is triggered in response to a signal from the host 102 to memory system 100. The controller 104 in the memory system may then instruct memory chip 106 to perform step 506. However, step 506 is not required to be triggered by a signal from host 103. In one embodiment, the controller 104 determines that step 506 should be performed. The host or controller could determine that step 506 should be performed for a variety of reasons. For example, either the host or the controller may be performing garbage collection. As another example, either the controller 104 or host 102 may determine that the memory should be refreshed.

In one embodiment of step 506, sensing circuit 306 senses a current of one or more monitor memory cells 114 in response to a sensing voltage. In one embodiment, sensing circuit 306 senses a resistance of one or more monitor memory cells 114 based on a sensed current. However, the sensed current is not required to correlate to a resistance. For example, the sensed current might correlate to a physical parameter other than resistance. Also, the sensing circuit 306 could sense a physical parameter of the monitor memory cells 114 other than current.

Step 506 includes a determination of whether there has been a state shift in the set of monitor memory cells 114 of more than a threshold. Referring to FIG. 4B, as one example, the memory core control circuits 108 determine whether the current in at least one memory cell in the set of monitor memory cells 114 has a current above $I_{THRESH}$.

If the state shift is more than the threshold, the data memory cells associated with the set of monitor memory cells are identified for data refresh, in step 510.

Steps 506-508 may be repeated from time to time. It is not required that these steps be repeated at a regular interval, however.

Figure 6A:
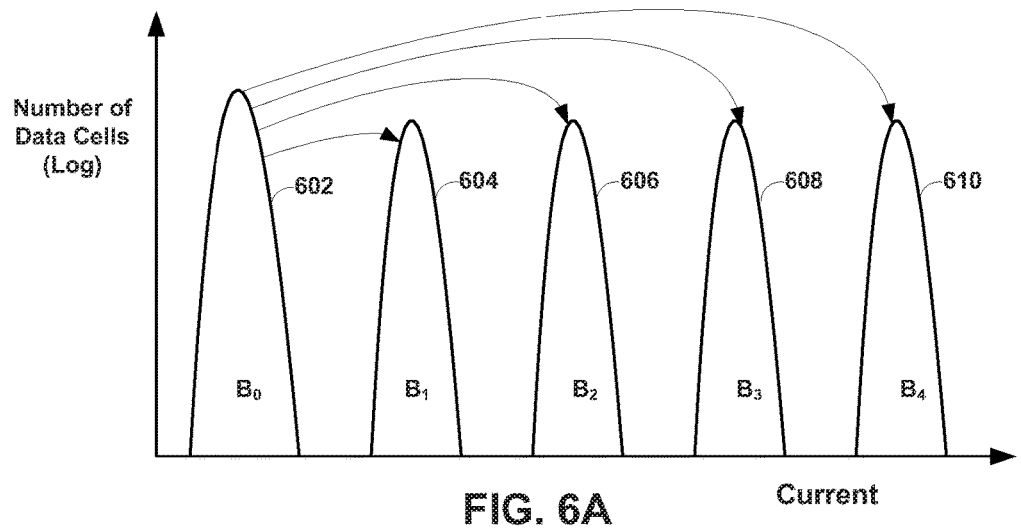
FIG. 6A depicts example of different states associated with one embodiment of a data memory cell programming technique.

FIG. 6A depicts an example of different states associated with one embodiment of a data memory cell programming technique. In one embodiment, the memory cells are ReRAM cells. The data memory cells could be, but are not required to be, BMCs. The current axis may therefore correspond to a resistance of the memory cells. It will be understood that the current may depend on both the resistance and a sensing voltage. Several distributions 602-610 are depicted. These may be alternatively be referred to as either current distributions or as resistance distributions. Distribution 602 corresponds to state $B_0$, distribution 604 corresponds to state $B_1$, distribution 606 corresponds to state $B_2$, distribution 608 corresponds to state $B_3$, and distribution 610 corresponds to state $B_4$. In one embodiment, states $B_1$, $B_2$, $B_3$, and $B_4$ are programmed data states. In one embodiment, state $B_0$ is used in the programming process, but is not a final program state.

Figure 6B:
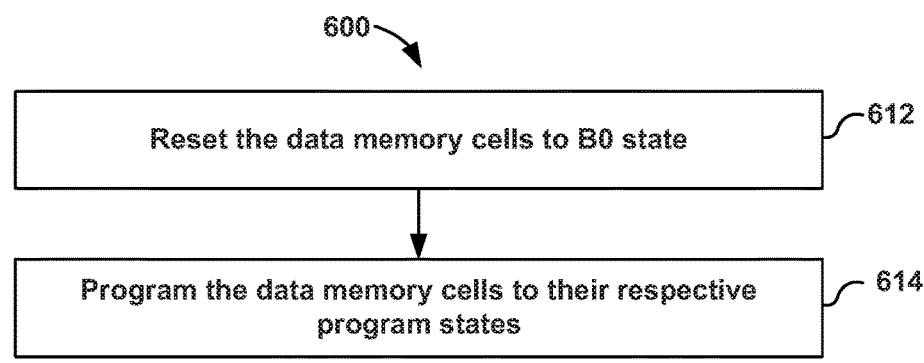
FIG. 6B depicts one embodiment of a process of data memory cell programming technique.

FIG. 6B depicts one embodiment of a process 600 of data memory cell programming technique, which may be used in step 502 of process 500. Process 600 may result in a very stable state, in some embodiments. For example, process 600 may result in very stable states, as depicted in FIG. 4A. Process 600 is used to program two-bits per memory cell. The process can be modified to store more or fewer bits per memory cell. Process 600 is performed on a memory chip 106 by data cell programming circuit 302, in one embodiment. Process 600 will be described with respect to the example distributions 602-610 in FIG. 6A.

Prior to process 600, the data memory cells 112 may be in any state. For example, the data memory cells may be distributed among distributions 604, 606, 608 and 610. However, note that it is not required for a data memory cell to be in one of the distributions 604, 606, 608 and 610. In step 612, the data memory cells 112 are reset to state $B_0$.

Thus, all data memory cells may be reset to have a current somewhere in distribution 602. As noted above, the current may depend on both the resistance and a sensing voltage. Thus, the data memory cells may be reset to a high resistance state, in one embodiment.

Step 614 includes programming the data memory cells 112 to their respective program states, from state $B_0$. Referring to FIG. 6A, each data memory cell may programmed from state $B_0$, to one of state $B_1$, state $B_2$, state $B_3$, or state $B_4$ (as represented by the arrows in FIG. 6A from state $B_0$ to a programmed state. In one embodiment, step 614 includes performing a set operation. Note that step 614 does not require that all of the data memory cells be programmed in parallel.

Many variations of process 600 are possible. In one embodiment, not all of the data memory cells 112 are reset to state $B_0$ in step 612. In one embodiment, a data memory cell 112 is only reset to state $B_0$ 602 if it needs to be programmed to a lower current state, in step 614. Those data memory cell 112 to be programmed to a higher current state in step 614, may be left in their present current state in step 612. Also, some data memory cells 112 may already be in the distribution that is their target program state. Such data memory cells 112 may be left untouched in one embodiment of process 600.

Figure 7A:
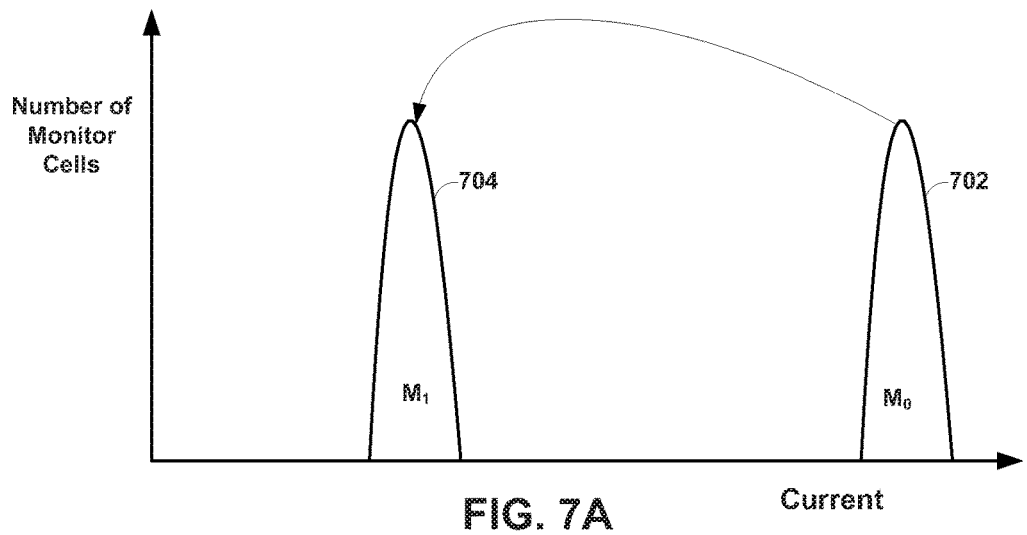
FIG. 7A depicts example of different states associated with one embodiment of a monitor memory cell programming technique.

FIG. 7A depicts example of different states associated with one embodiment of a monitor memory cell programming technique. In one embodiment, the memory cells are ReRAM cells. The monitor memory cells could be, but are not required to be, BMCs. The current axis may therefore correspond to a resistance of the memory cells. It will be understood that the current may depend on both the resistance and a sensing voltage. Two distributions 702, 704 are depicted. The distributions represent a possible range of current for a low resistance state ($M_0$) and a high resistance state ($M_1$). These may be alternatively be referred to as either current distributions or as resistance distributions. Distribution 702 corresponds to state $M_0$, distribution 704 corresponds to monitor state $M_1$.

Figure 7B:
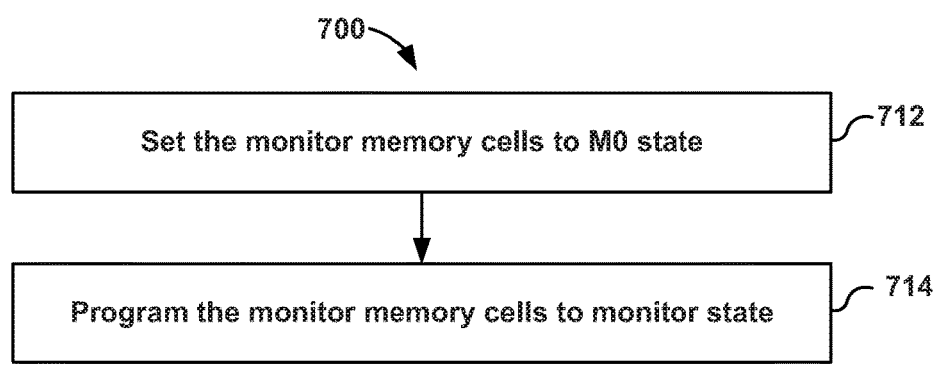
FIG. 7B depicts one embodiment of a process of monitor memory cell programming technique.

FIG. 7B depicts one embodiment of a process 700 of monitor memory cell programming technique, which may be used in step 504 of process 500. Process 700 may result in a less stable state than the data memory cell programming technique of process 600, in some embodiments. For example, process 700 may result in a current versus time curve 406, as depicted in FIG. 4B. Process 700 is performed on a memory chip 106 by monitor cell programming circuit 304, in one embodiment. Process 700 will be described with respect to the example distributions 702, 704 in FIG. 7A.

Prior to process 700, the monitor memory cells 114 may be in any state. For example, the monitor memory cells may have a resistance associated with any current on the current axis in FIG. 7A. In step 712, the monitor memory cells 114 are set to state $M_0$. Thus, monitor memory cells may be set to have a current somewhere in distribution 702. As noted above, the current may depend on both the resistance and a sensing voltage. Thus, the monitor memory cells may be set to a low resistance state, in one embodiment.

Step 714 includes programming the monitor memory cells 114 to a monitor state, from state $M_0$. Referring to FIG. 7A, each monitor memory cell may programmed from state $M_0$ to one of state $M_1$ (as represented by the arrow in FIG. 7A). In one embodiment, step 714 includes performing a reset operation.

A difference between the data memory cell programming technique of process 600 and the monitor memory cell programming technique of process 700 is the direction from which the final or "target" state is approached. In the data memory cell programming technique of process 600, the target state is approached from a lower current (or higher resistance). In the monitor memory cell programming technique of process 700, the target state is approached from a higher current (or lower resistance). For at least some ReRAM cells, if the target state is approached from one resistance direction the state is more stable compared to if the target resistance state is approached from the opposite resistance direction. Here, the "resistance direction" refers to the resistance change between the state in step 612 and 614 in process 600, and the resistance change between the state in step 712 and 714 in process 700. This concept is summarized in the process 800 of FIG. 8.

Figure 8:
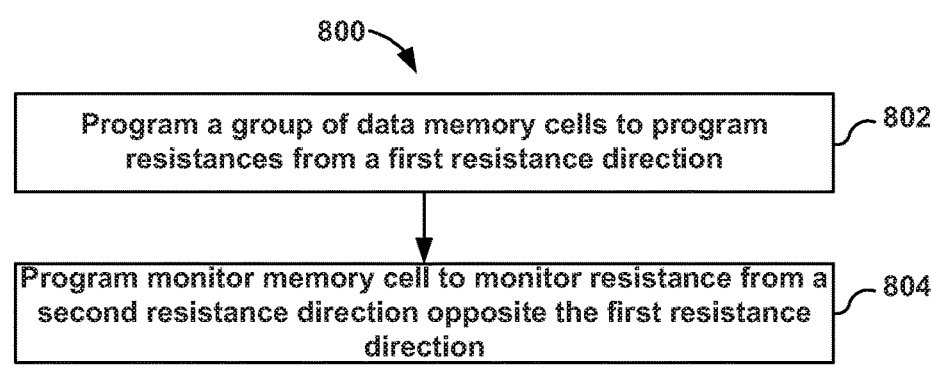
FIG. 8 depicts a flowchart of one embodiment of a process of programming data memory cells and a set of monitor memory cells.

FIG. 8 depicts a flowchart of one embodiment of a process 800 of programming data memory cells 112 and a set of monitor memory cells 114. The process 800 may be performed by memory core control circuits 108 on a memory chip 106.

Step 802 includes programming a group of data memory cells to program resistances from a first resistance direction. Step 802 is one embodiment of step 502 from process 500.

Step 804 includes programming a set of monitor memory cells to a monitor resistance from a second resistance direction that is opposite the first resistance direction. Step 804 is one embodiment of step 504 from process 500.

Figure 9A:
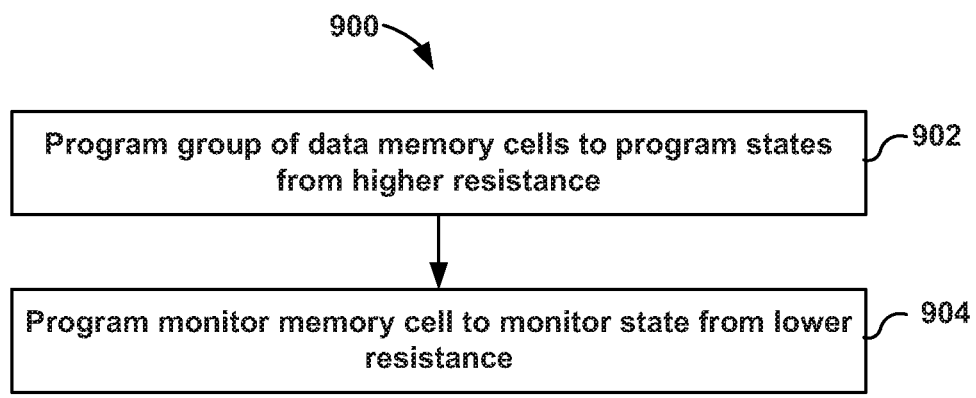
FIGS. 9A and 9B are flowcharts of two alternative schemes for programming data memory cells and monitor memory cells.
Figure 9B:
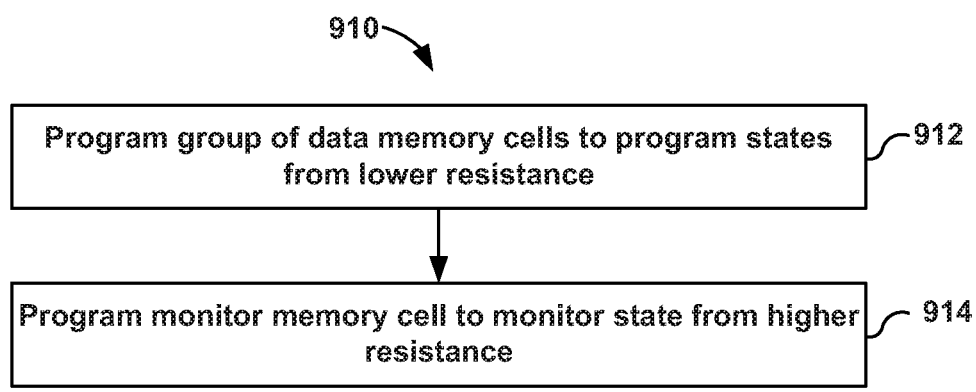

FIGS. 9A and 9B are flowcharts of two alternative schemes for programming data memory cells 112 and monitor memory cells 114 such that the state of the monitor memory cells is less stable than the state of the data memory cells. These two schemes are two alternatives for the more general flow of process 800.

FIG. 9A is a flowchart of a process 900 in which the final program state of the data memory cells is approached from a higher resistance (and the monitor state is approached from a lower resistance). Step 902 includes programming a group of data memory cells 112 to program states from a higher resistance. In one embodiment, the group of data memory cells 112 are programmed to their final program state from state $B_0$ 602. However, the data memory cells could be programmed to the final program state from any of state $B_1$ 604, state $B_2$ 606, or state $B_3$ 608, providing that such a state has a higher resistance than the final program state. Also, it is not required that the starting resistance of the data memory cells fit into one of the distributions 602-608. Step 902 is one embodiment of step 502 of process 500.

Step 904 includes programming a set of one or more monitor memory cells 114 to a monitor resistance from a lower resistance. In one embodiment, the set of monitor memory cells 114 are programmed to state $M_1$ 704 from state $M_0$ 702. However, the starting point is not required to be state $M_0$ 702. The starting point could be any resistance that is lower than monitor state $M_1$ 704. Step 904 is one embodiment of step 504 of process 500.

Note that not all types of memory cells may react the same to programming. FIG. 9B is a flowchart of a process 900 in which the final program state of the data memory cells is approached from a lower resistance (and the monitor state is approached from a higher resistance). Step 912 includes programming a group of data memory cells 112 to program states from a lower resistance. In one embodiment, the group of data memory cells 112 are programmed to their final program state from a state above $B_4$ 610 (here, "above" means being associated with a higher current than $B_4$ 610). However, the data memory cells could be programmed to the final program state from any of state $B_2$ 606, state $B_3$ 608, or state $B_4$ 610, providing that such a state has a lower resistance than the final program state. Also, it is not required that the starting resistance of the data memory cells fit into one of the distributions 604-610. Step 912 is one embodiment of step 502 of process 500.

Step 914 includes programming a set of one or more monitor memory cells 114 to a monitor resistance from a higher resistance. In one embodiment, the set of monitor memory cells 114 are programmed to state $M_0$ 702 from state $M_1$ 704 (with reference to FIG. 7A). However, the starting point is not required to be state $M_1$ 704. The starting point could be any resistance that is lower than state $M_0$ 704. Step 914 is one embodiment of step 504 of process 500.

Note that in the process 910 of FIG. 9B, the monitor state is a relatively low resistance, which may be associated with a relatively high current. The curve of the resistance versus time may be similar to curve 408 in FIG. 4C. Note that the current may decrease over time in that example. Hence, the resistance may increase over time.

Figure 10A:
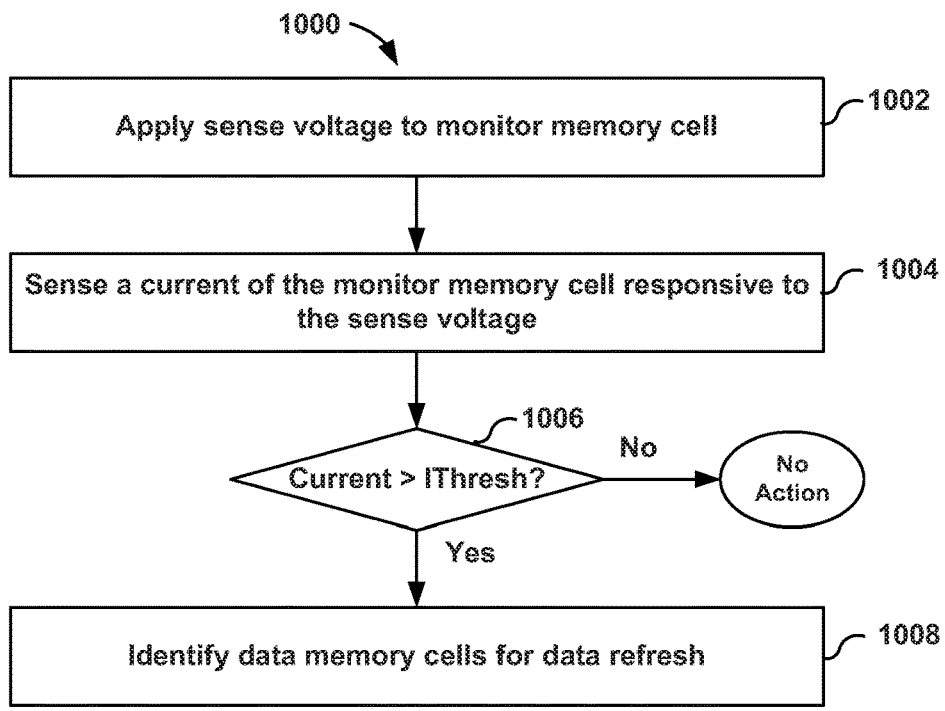
FIG. 10A is a flowchart of one embodiment of a process of sensing monitor memory cells, and identifying data memory cells for refresh based on the sensing.

FIG. 10A is a flowchart of one embodiment of a process 1000 of sensing monitor memory cells 114, and identifying data memory cells for refresh based on the sensing. The process 1000 is one embodiment of steps 506-510 of FIG. 5. The process 1000 is performed by sensing circuit 306, in one embodiment. The process 1000 is discussed with respect to a single monitor memory cell, but may be performed in parallel with more than one monitor memory cell. In some cases, the process is performed in parallel to sense monitor memory cells that monitor different groups of data memory cells 112.

Step 1002 includes applying a sense voltage to the monitor memory cell 114. In one embodiment, voltage generators (or voltage regulators) for first control lines 122 generate first (e.g., selected) control line voltages. Voltage generators for second control lines 124 generate second (e.g., unselected) control line voltages.

Step 1004 includes sensing a current of the monitor memory cell. In one embodiment, signal generators for reference signals 126 generate a reference voltage and/or current signal to be used to test the monitor memory cell. For example, a reference current may be generated to test whether a current that flows in monitor memory cell 114 is above/below the reference current.

Step 1006 is a determination of whether the current of the monitor memory cell is above $I_{THRESH}$ (see, for example, FIGS. 4B, 4D). Thus, step 1004 may be used to determine whether the state of the monitor memory cell has shifted by more than a permitted amount. Note that another sensing technique may be used to test the shift in state of the monitor memory cell.

If the current of the monitor memory cell is above $I_{THRESH}$, then the associated data memory cells are identified for data refresh.

Figure 10B:
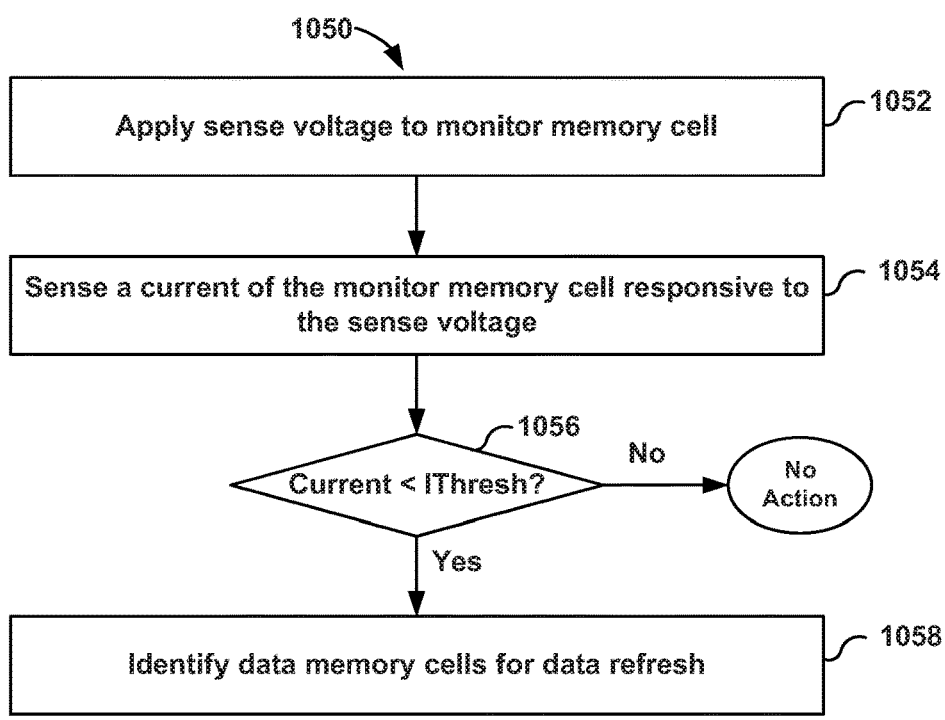
FIG. 10B is a flowchart of an alternative process of sensing monitor memory cells, and identifying data memory cells for refresh based on the sensing.

The process of FIG. 10A might be used when it is expected that the resistance of the monitor memory cell 114 is going to go down over time (e.g., current increase). FIG. 10B is a flowchart of an alternative process 1050 in which it is expected that the resistance of the monitor memory cell is going to go up over time (e.g., current decrease). This may be used for a case such as illustrated in FIG. 4C. A difference between process 1050 and 1000 is in step 1056, the determination is whether the monitor memory cell current has fallen below $I_{THRESH}$. Note that $I_{THRESH}$ could have a different magnitude in process 1050 than in process 1000.

In some embodiments, monitor memory cells 114 associated with different groups of data memory cells 112 are sensed in parallel. For example, each set of one or more monitor memory cells 114 may be associated with a page of data memory cells. In other words, each set of monitor memory cells 114 may be monitoring a different page of data memory cells.

Figure 11:
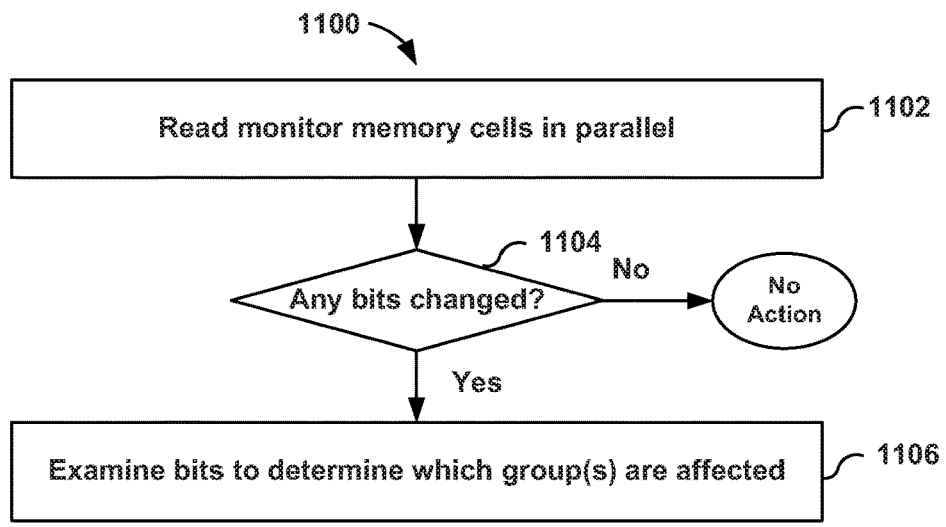
FIG. 11 is a flowchart of one embodiment of a process of sensing multiple sets of monitor memory cells in parallel.

FIG. 11 is a flowchart of one embodiment of a process 1100 of sensing multiple sets of monitor memory cells 114 in parallel. Process 1100 is performed by sensing circuit 306, in one embodiment. Process 1000 can be used during one embodiment of process 1100. Process 1050 can be used during one embodiment of process 1100.

Step 1102 includes sensing monitor memory cells 114 in parallel. In one embodiment, steps 1002 and 1004 of process 1000 are performed on each monitor memory cells 114. In one embodiment, steps 1052 and 1054 are performed on each monitor memory cells 114. A result of step 1102 may be to store a bit of information for each monitor memory cells 114. The value of the bit depends on whether the current in the monitor memory cells 114 is above/below a reference current, in one embodiment. For the sake of illustration, it will be assumed that a value of "0" indicates that the monitor memory cell's current has not yet crossed $I_{THRESH}$, whereas a value of "1" indicates that the monitor memory cell's current has crossed $I_{THRESH}$. Note that the direction of crossing may depend on whether the resistance is tending downward or upward.

Step 1104 is a determination of whether any of the bits changed. As one example, step 1104 determines if there are any "1s". In other words, step 1104 tests for whether the bit of information for any of the monitor memory cells 114 indicates that the monitor memory cells 114 had its state shift by more than a permitted amount. If no bits have shifted, then the process 1100 may conclude with no action.

If at least one bit has shifted, then the process 1100 continues at step 1106 by examining the bits further. In one embodiment, the sensing circuit 306 examines the bits to determine which group(s) of data memory cells 112 are associated with the changed bit(s). Thus, the data memory cells in need of a refresh may be determined very economically.

Figure 12A:
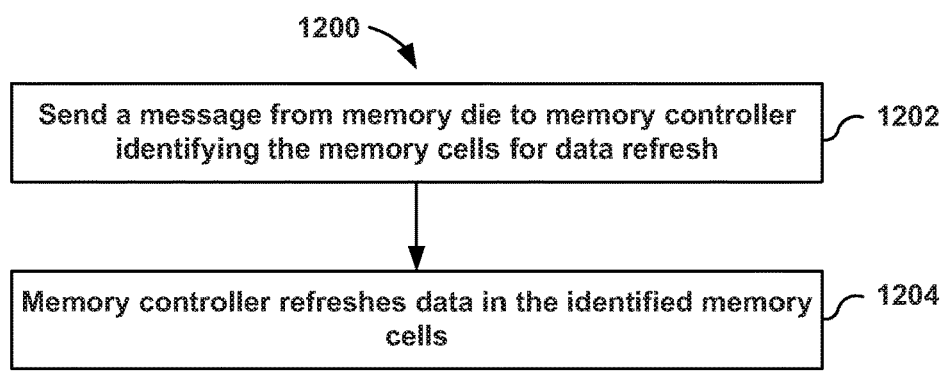
FIGS. 12A and 12B are alternative embodiments for handing a data refresh of data memory cells.
Figure 12B:
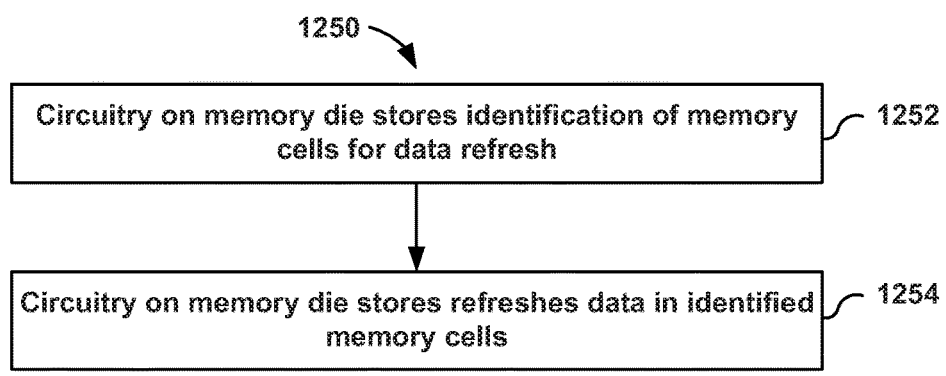

FIGS. 12A and 12B are alternative embodiments for handing a data refresh of data memory cells 112. One alternative is to have the memory controller handle the data refresh. Another alternative is to have circuitry on the memory die 106 handle the date refresh.

FIG. 12A is a flowchart of one embodiment of a process 1200 in which a memory controller handles a data refresh. The process 1200 may be performed after a group of data memory cells have been identified for a data refresh in, for example, step 508 of process 500. Step 1202 includes sending a message from a memory die 106 to a memory chip controller 104 identifying the memory cells. The message could identify the memory cells by an address of a physical page, as one example.

Step 1204 includes the memory chip controller 104 refreshing data in the identified memory cells. The memory chip controller 104 could read data in the identified memory cells, perform any needed error correction, and re-write the data to the same data memory cells 112 or a different group of data memory cells 112.

FIG. 12B is a flowchart of one embodiment of a process 1250 in which circuitry on a memory die 106 handles a data refresh. The process 1250 may be performed after a group of data memory cells have been identified for a data refresh in, for example, step 508 of process 500. Step 1252 includes circuitry on a memory die 106 storing information that identifies the memory cells. The information could identify the memory cells by an address of a physical page, as one example.

Step 1254 includes the circuitry on a memory die 106 refreshing data in the identified memory cells. In some embodiments, there is not a need to perform error correction of the data because the monitor memory cells 114 are very accurate at identifying when data needs to be refreshed well before there is a need for error correction. Hence, it is not required for the memory die 106 to perform error correction.

A first embodiment includes an apparatus, comprising: a plurality of non-volatile memory cells comprising a group of data memory cells and a monitor memory cell; and a control circuit in communication with the plurality of non-volatile memory cells. The control circuit is configured to program the group of data memory cells with a first programming technique; program the monitor memory cell with a second programming technique for which state retention is less stable than the first programming technique. The monitor memory cell is programmed contemporaneously with the group of data memory cells. The control circuit is further configured to identify the group of data memory cells for data refresh responsive to a determination that the monitor memory cell has incurred a state shift of more than a threshold.

In a second embodiment, and in furtherance of the first embodiment, the second programming technique creates a resistance in the monitor memory cell that is less stable than the resistance in ones of the group of data memory cells.

In a third embodiment, and in furtherance of the first or second embodiments, the plurality of non-volatile memory cells are resistance random access memory (ReRAM) cells. To implement the first programming technique the control circuit is further configured to program the group of data memory cells to their program resistance from a first resistance direction. To implement the second programming technique the control circuit is further configured to program the monitor memory cell to its monitor resistance from a second resistance direction opposite the first resistance direction.

In a fourth embodiment, and in furtherance of any of the first through third embodiments, the plurality of non-volatile memory cells are resistance random access memory (ReRAM) cells. To program the group of data memory cells with the first programming technique the control circuit is configured to program the group of data memory cells to a program resistance from a lower resistance. To program the monitor memory cell with the second programming technique the control circuit is configured to program the monitor memory cell to a monitor resistance from a higher resistance.

In a fifth embodiment, and in furtherance of any of the first through third embodiments, the plurality of non-volatile memory cells are resistance random access memory (ReRAM) cells. To program the group of data memory cells with the first programming technique the control circuit is further configured to program the group of data memory cells to a program resistance from a higher resistance. To program the monitor memory cell with the second programming technique the control circuit is further configured to program the monitor memory cell to a monitor resistance from a lower resistance.

In a sixth embodiment, and in furtherance of any of the first through fifth embodiments, the group of data memory cells and the monitor memory cell are barrier modulated cells (BMC) resistive random access memory cells.

In a seventh embodiment, and in furtherance of any of the first through sixth embodiments, the state shift of more than the threshold is a resistance of the monitor memory cell changing by more than an allowed amount.

In an eighth embodiment, and in furtherance of any of the first through seventh embodiments, the control circuit is further configured to sense a plurality of monitor memory cells in parallel. Each of the monitor memory cells is associated with a group of data memory cells that were programmed using the first programming technique when the associated monitor memory cell was programmed using the second programming technique. The control circuit is further configured identify ones of the groups of data memory cells for data refresh based on which of the plurality of monitor memory cells incurred a state shift of more than the threshold.

In a ninth embodiment, and in furtherance of any of the first through eighth embodiments, the apparatus further comprises a memory die. The plurality of non-volatile memory cells and the control circuit reside on the memory die.

In a tenth embodiment, and in furtherance of the ninth embodiment, the control circuit is further configured to send a message from the memory die to a memory controller that identifies the group of data memory cells for data refresh.

In an eleventh embodiment, and in furtherance of any of the first through tenth embodiments, the control circuit is further configured to refresh data in the group of data memory cells responsive to identifying the group of data memory cells.

In a twelve embodiment, and in furtherance of any of the first through eleventh embodiments the control circuit is further configured to: apply a sense voltage to the monitor memory cell after programming the monitor memory cell with the second programming technique; sense a current of the monitor memory cell in response to the sense voltage; and determine whether the monitor memory cell has incurred the state shift of more than the threshold based on a magnitude of the current.

One embodiment includes a method of operating a memory system having a plurality of resistance random access memory (ReRAM) cells. The method comprises programming a group of data ReRAM cells with a first programming technique to program resistances; programming a monitor ReRAM cell with a second programming technique to a monitor resistance contemporaneously with programming the group of data memory cells. The second programming technique creating a monitor resistance in the monitor memory cell that less stable than the program resistances in ones of the group of data memory cells. The method further comprises refreshing data in the group of data ReRAM cells responsive to a determination that the monitor memory cell has incurred a resistance change of more than a threshold.

One embodiment includes a non-volatile memory system, comprising: a plurality of resistance random access memory (ReRAM) cells, including a group of data ReRAM cells and a monitor ReRAM cell; data memory cell programming means for programming the group of data ReRAM cells with a first programming technique; monitor memory cell programming means for programming the monitor ReRAM cell with a second programming technique at about the same time as the group of data memory cells are programmed, the monitor memory cell programming means further for creating a monitor resistance in the monitor memory cell that is less stable than a program resistance in ones of the group of data memory cells; sensing means for determining whether the monitor resistance of the monitor ReRAM cell has changed by more than a threshold; and data refresh means for refreshing data in the group of data ReRAM cells responsive to a determination that the monitor resistance has changed by more than the threshold.

The data memory cell programming means may include one or more of memory core control circuits 108, address decoders 120, voltage generators for first control lines 122, voltage generators for second control lines 124, signal generator for reference signals 126, row decoders 152, column decoder 154, read/write circuits 146, data cell programming circuit 302 state machine, sense amplifiers and/or other hardware or software.

The monitor memory cell programming means may include one or more of memory core control circuits 108, address decoders 120, voltage generators for first control lines 122, voltage generators for second control lines 124, signal generator for reference signals 126, row decoders 152, column decoder 154, read/write circuits 146, monitor cell programming circuit 304 state machine, sense amplifiers and/or other hardware or software.

Sensing means may include one or more of memory core control circuits 108, address decoders 120, voltage generators for first control lines 122, voltage generators for second control lines 124, signal generator for reference signals 126, row decoders 152, column decoder 154, read/write circuits 146, monitor cell programming circuit 304 state machine, sense amplifiers and/or other hardware or software.

Data refresh means may include one or more of memory core control circuits 108, address decoders 120, voltage generators for first control lines 122, voltage generators for second control lines 124, signal generator for reference signals 126, row decoders 152, column decoder 154, read/write circuits 146, monitor cell programming circuit 304 state machine, sense amplifiers and/or other hardware or software.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   a plurality of non-volatile memory cells comprising a group of data memory cells and a monitor memory cell, wherein the plurality of non-volatile memory cells are resistive random access memory (ReRAM) cells; and
   a control circuit in communication with the plurality of non-volatile memory cells, the control circuit configured to:
   program the group of data memory cells with a first programming technique, including program the group of data memory cells to their program resistance from a first resistance direction;
   program the monitor memory cell with a second programming technique for which state retention is less stable than the first programming technique, including program the monitor memory cell to its monitor resistance from a second resistance direction opposite the first resistance direction, the monitor memory cell programmed contemporaneously with the group of data memory cells; and
   identify the group of data memory cells for data refresh responsive to a determination that the monitor memory cell has incurred a state shift of more than a threshold.

2. The apparatus of claim 1, wherein the second programming technique creates a resistance in the monitor memory cell that is less stable than the resistance in ones of the group of data memory cells.

3. The apparatus of claim 1, wherein:
   to program the group of data memory cells with the first programming technique from the first resistance direction the control circuit is further configured to program the group of data memory cells to a program resistance from a lower resistance; and
   to program the monitor memory cell with the second programming technique from the second resistance direction the control circuit is further configured to program the monitor memory cell to a monitor resistance from a higher resistance.

4. The apparatus of claim 1, wherein:
   to program the group of data memory cells with the first programming technique from the first resistance direction the control circuit is further configured to program the group of data memory cells to a program resistance from a higher resistance; and
   to program the monitor memory cell with the second programming technique from the second resistance direction the control circuit is further configured to program the monitor memory cell to a monitor resistance from a lower resistance.

5. The apparatus of claim 1, wherein the group of data memory cells and the monitor memory cell are barrier modulated cells (BMC) resistive random access memory cells.

6. The apparatus of claim 1, wherein the state shift of more than the threshold is a resistance of the monitor memory cell changing by more than an allowed amount.

7. The apparatus of claim 1, wherein the control circuit is further configured to:
   sense a plurality of monitor memory cells in parallel, wherein each of the monitor memory cells is associated with a group of data memory cells that were programmed using the first programming technique when the associated monitor memory cell was programmed using the second programming technique; and
   identify ones of the groups of data memory cells for data refresh based on which of the plurality of monitor memory cells incurred a state shift of more than the threshold.

8. The apparatus of claim 1, further comprising a memory die, wherein the plurality of non-volatile memory cells and the control circuit reside on the memory die.

9. The apparatus of claim 8, wherein the control circuit is further configured to send a message from the memory die to a memory controller that identifies the group of data memory cells for data refresh.

10. The apparatus of claim 1, wherein the control circuit is further configured to:
refresh data in the group of data memory cells responsive to identifying the group of data memory cells.

11. The apparatus of claim 1, wherein the control circuit is further configured to:
apply a sense voltage to the monitor memory cell after programming the monitor memory cell with the second programming technique;
sense a current of the monitor memory cell in response to the sense voltage; and
determine whether the monitor memory cell has incurred the state shift of more than the threshold based on a magnitude of the current.

12. A method of operating a memory system having a plurality of resistive random access memory (ReRAM) cells, wherein the plurality of ReRAM cells are barrier modulated cells (BMC), the method comprising:
programming a group of data barrier modulated cells with a first programming technique to program resistances;
programming a monitor barrier modulated cell with a second programming technique to a monitor resistance contemporaneously with programming the group of data barrier modulated cells, the second programming technique creating a monitor resistance in the monitor barrier modulated cell that is less stable than the program resistances in ones of the group of data barrier modulated cells; and
refreshing data in the group of data barrier modulated cells responsive to a determination that the monitor barrier modulated cell has incurred a resistance change of more than a threshold.

13. The method of claim 12, wherein:
programming the group of data barrier modulated cells with the first programming technique comprises programming the group of data barrier modulated cells to the program resistances from a lower resistance; and
programming the monitor barrier modulated cell with the second programming technique comprises programming the monitor barrier modulated cell to the monitor resistance from a higher resistance.

14. The method of claim 12, wherein:
programming the group of data barrier modulated cells with the first programming technique comprises programming the group of data barrier modulated cells to the program resistances from a higher resistance; and
programming the monitor barrier modulated cell with the second programming technique comprises programming the monitor barrier modulated cell to the monitor resistance from a lower resistance.

15. The method of claim 12, further comprising sensing a plurality of monitor barrier modulated cells in parallel, wherein each of the monitor barrier modulated cells is associated with a group of data barrier modulated cells that were programmed using the first programming technique when the associated monitor barrier modulated cell was programmed using the second programming technique; and
identifying ones of the groups of data barrier modulated cells for data refresh based on which of the plurality of monitor barrier modulated cells incurred a state shift of more than the threshold.

16. A non-volatile memory system, comprising:
a plurality of resistive random access memory (ReRAM) cells, wherein the plurality of ReRAM cells are barrier modulated memory cells comprising a non-volatile memory material having a semiconductor material layer adjacent a conductive oxide material layer, including a group of data barrier modulated memory cells and a monitor barrier modulated memory cell;
data memory cell programming means for programming the group of data barrier modulated memory cells with a first programming technique;
monitor memory cell programming means for programming the monitor barrier modulated memory cell with a second programming technique at about the same time as the group of data barrier modulated memory cells are programmed, the monitor memory cell programming means further for creating a monitor resistance in the monitor barrier modulated memory cell that is less stable than a program resistance in ones of the group of data barrier modulated memory cells;
sensing means for determining whether the monitor resistance of the monitor barrier modulated memory cell has changed by more than a threshold; and
data refresh means for refreshing data in the group of data barrier modulated memory cells responsive to a determination that the monitor resistance has changed by more than the threshold.

17. The non-volatile memory system of claim 16, wherein:
the data memory cell programming means is further for programming the group of data barrier modulated memory cells to their respective program resistances from a first resistance direction; and
the monitor memory cell programming means is further for programming the monitor barrier modulated memory cell to the monitor resistance from a second resistance direction opposite the first resistance direction.

18. An apparatus, comprising:
a plurality of resistive random access memory cells comprising a group of data barrier modulated memory cells (BMC) and a monitor barrier modulated memory cell; and
a control circuit in communication with the plurality of resistive random access memory cells, the control circuit configured to:
program the group of data barrier modulated memory cells with a first programming technique;
program the monitor barrier modulated memory cell with a second programming technique for which state retention is less stable than the first programming technique, the monitor barrier modulated memory cell programmed contemporaneously with the group of data barrier modulated memory cells; and
identify the group of data barrier modulated memory cells for data refresh responsive to a determination that the monitor barrier modulated memory cell has incurred a state shift of more than a threshold.

19. An apparatus, comprising:
a memory array comprising a plurality of groups of data non-volatile memory cells;
the memory array further comprising a plurality of monitor non-volatile memory cells; and
a control circuit in communication with the plurality of groups of data non-volatile memory cells and the plurality of monitor non-volatile memory cells, the control circuit configured to:
program the plurality of groups of data non-volatile memory cells with a first programming technique;

program the plurality of monitor non-volatile memory cells with a second programming technique for which state retention is less stable than the first programming technique, wherein each of the monitor memory cells is associated with a group of data memory cells that were programmed using the first programming technique when the associated monitor memory cell was programmed using the second programming technique, each monitor non-volatile memory cell programmed contemporaneously with one of the groups of data non-volatile memory cells;

sense the plurality of monitor non-volatile memory cells in parallel; and in response to at least one of the monitor non-volatile memory cells incurring a state shift of more than a threshold, identify the group or groups of data non-volatile memory cells that are associated with the at least one monitor non-volatile memory cell incurring a state shift of more than the threshold for data refresh.

20. An apparatus, comprising:

a memory die comprising a plurality of non-volatile memory cells and a control circuit;

the plurality of non-volatile memory cells comprising a group of data memory cells and a monitor memory cell; and the control circuit in communication with the plurality of non-volatile memory cells, the control circuit configured to:

program the group of data memory cells with a first programming technique, including program the group of data memory cells to their program resistance from a lower resistance;

program the monitor memory cell with a second programming technique for which state retention is less stable than the first programming technique, including program the monitor memory cell to its monitor resistance from a higher resistance, the monitor memory cell programmed contemporaneously with the group of data memory cells;

identify the group of data memory cells for data refresh responsive to a determination that the monitor memory cell has incurred a state shift of more than a threshold; and send a message from the memory die to a memory controller that identifies the group of data memory cells for data refresh.

* * * * *